US007075327B2

(12) United States Patent
Dimino et al.

(10) Patent No.: US 7,075,327 B2
(45) Date of Patent: Jul. 11, 2006

(54) SYSTEM AND METHOD FOR PROACTIVE MOTOR WELLNESS DIAGNOSIS

(75) Inventors: Steven A. Dimino, Wauwatosa, WI (US); Thomas G. Habetler, Snellville, GA (US); Ramzy R. Obaid, Smyrna, GA (US); Slobodan Krstic, Brookfield, WI (US); Michael P. Nowak, Milwaukee, WI (US); Yanzhen Liu, Milwaukee, WI (US)

(73) Assignee: Eaton Corporation, Cleveland, OH (US)

( * ) Notice: Subject to any disclaimer, the term of this patent is extended or adjusted under 35 U.S.C. 154(b) by 38 days.

(21) Appl. No.: 10/859,506

(22) Filed: Jun. 2, 2004

(65) Prior Publication Data

US 2005/0007096 A1    Jan. 13, 2005

Related U.S. Application Data

(60) Provisional application No. 60/479,318, filed on Jun. 18, 2003.

(51) Int. Cl.
*G01R 31/34* (2006.01)

(52) U.S. Cl. .................. 324/772; 702/183; 702/185

(58) Field of Classification Search ............... None
See application file for complete search history.

(56) References Cited

U.S. PATENT DOCUMENTS

| 5,519,337 | A | 5/1996 | Casada |
| 5,566,092 | A | 10/1996 | Wang et al. |
| 5,570,256 | A | 10/1996 | Schoen et al. |
| 5,629,870 | A | 5/1997 | Farag et al. |
| 5,644,458 | A | 7/1997 | Schoen et al. |
| 5,726,905 | A | 3/1998 | Yazici et al. |
| 6,035,265 | A * | 3/2000 | Dister et al. ............ 702/183 |
| 6,053,047 | A * | 4/2000 | Dister et al. ............ 73/593 |
| 6,204,751 | B1 * | 3/2001 | Bolda et al. ......... 340/286.02 |
| 6,285,947 | B1 | 9/2001 | Divljakovic et al. |
| 6,330,525 | B1 | 12/2001 | Hays et al. |
| 6,459,557 | B1 * | 10/2002 | Haensgen et al. ....... 361/93.2 |
| 6,529,135 | B1 | 3/2003 | Bowers et al. |
| 2002/0186039 | A1 | 12/2002 | Devancy et al. |

FOREIGN PATENT DOCUMENTS

| EP | 1 298 511 A1 | 4/2003 |
| WO | WO 01/01213 A1 | 1/2001 |
| WO | WO 02/091546 A2 | 11/2002 |

OTHER PUBLICATIONS

C. M. Riley et al., "A Method for the Sensorless Determination of the Vibration Level in Inverter-Driven Induction Motors," IEEE, 1999, pp. 165-167, no month.

(Continued)

*Primary Examiner*—Minh N. Tang
(74) *Attorney, Agent, or Firm*—Ziolkowski Patent Solutions Group, SC

(57) ABSTRACT

The present invention is directed to a power meter or overload relay including a housing and a plurality of sensors configured to monitor operation of a motor. A processor disposed within the housing and configured to receive operational feedback from the plurality of sensor and proactively determine an operational wellness of the motor from the operational feedback.

25 Claims, 21 Drawing Sheets

OTHER PUBLICATIONS

R. R. Obaid et al., "A Simplified Technique for Detecting Mechanical Faults Using Stator Current in Small Induction Motors," IEEE, 2000, pp. 479-483, no month.

T. G. Habetler et al., "Complete Current-Based Induction Motor Condition Monitoring: Stator, Rotor, Bearings, and Load," IEEE, 2002, pp. 3-8, no month.

R. R. Obaid et al., "Current-Based Algorithm for Mechanical Fault Detection in Induction Motors with Arbitrary Load Conditions," IEEE, 2003, pp. 1347-1351, no month.

R. R. Obaid et al., "Detecting Load Unbalance and Shaft Misalignment Using Stator Current in Inverter-Driven Induction Motors," IEEE, 2003, pp. 1454-1458, no month.

R. R. Obaid et al., "Effect of Load on Detecting Mechanical Faults in Small Induction Motors," IEEE, 2003, pp. 307-311, no month.

Y. Liu, "Cavitation and Mechanical Fault Detection for Motor-Pump Rigs," Mechanical Fault Detection: Motor Current and Motor Power Analysis, Jan. 30, 2002, pp. 1-4.

D. B. Durocher et al., "Predictive Versus Preventive Maintenance," IEEE, Sep./Oct. 2004, pp. 12-21.

R. R. Obaid et al., "Stator Current Analysis for Bearing Damage Detection in Induction Motors," IEEE, 2003, pp. 182-187, no month.

* cited by examiner

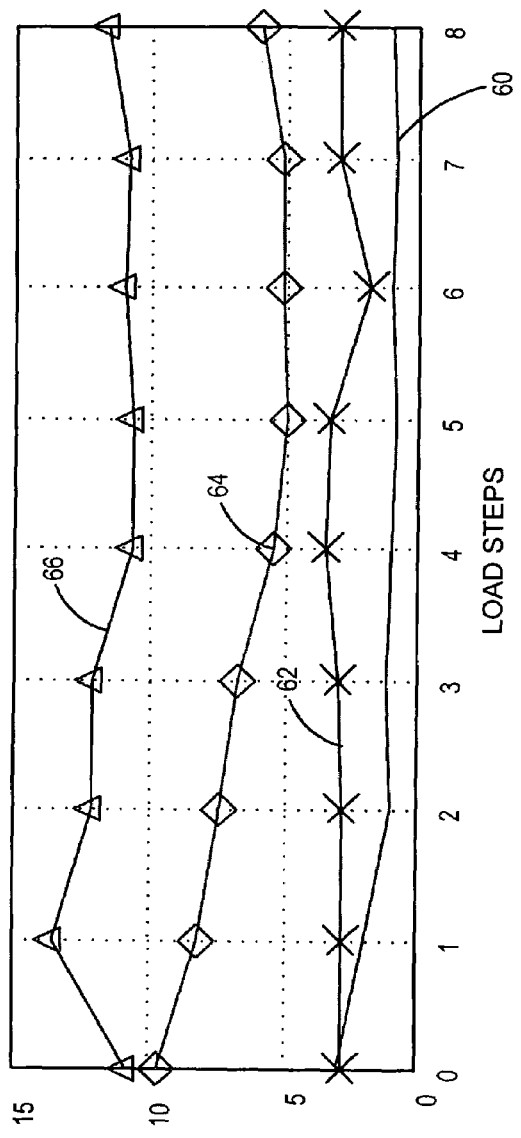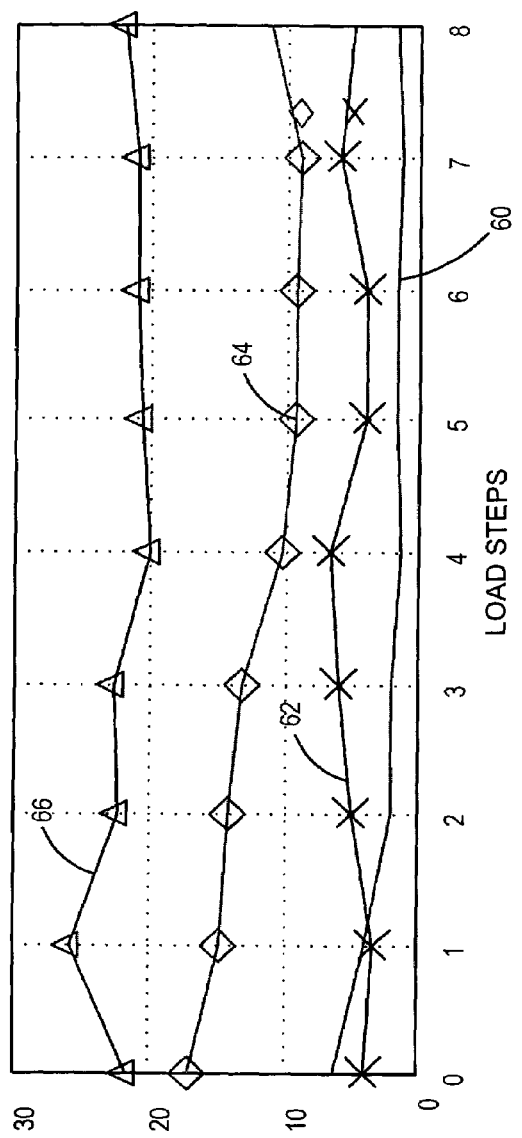

sional Application Ser. No. 60/479,318 filed Jun. 18, 2003
SYSTEM AND METHOD FOR PROACTIVE MOTOR WELLNESS DIAGNOSIS

CROSS-REFERENCE TO RELATED APPLICATION

This application claims the benefit of prior U.S. Provisional Application Ser. No. 60/479,318 filed Jun. 18, 2003 and entitled METHOD AND SYSTEM FOR IMPLEMENTING MOTOR DIAGNOSTICS AND SYSTEM WELLNESS.

BACKGROUND OF THE INVENTION

The present invention relates generally to motors and, more particularly, to a system and method for proactive detection of conditions indicative of potential motor faults. Baseline data is generated by a wellness relay operating in a "learning" mode by monitoring a given motor known to be operating under "healthy" conditions. After the "learning" mode is complete, the wellness relay monitors the given motor and performs at least one of current signature analysis (CSA) and power signature analysis (PSA) to determine a motor fault index of the given motor. Specifically, frequency spectrum components within carefully selected sidebands are summed and mapped to one of a plurality of load bins. By comparing the motor fault index to the baseline data associated with the mapped load bin, the wellness relay detects conditions indicative of potential motor faults and communicates wellness alerts prior to an occurrence of a potential motor fault.

In North America, three-phase induction motors consume a large percentage of all generated electrical capacity. Many applications for this "workhorse" of industry are fan and pump industrial applications. For example, in a typical integrated paper mill, low voltage and medium voltage motors may comprise nearly 70% of all driven electrical loads. Due to the prevalence of these motors in industry, it is paramount that the three-phase motor be reliable. Industry reliability surveys suggest that motor failures typically fall into one of four major categories. Specifically, motor faults typically result from bearing failure, stator turn faults, rotor bar failure, or other faults/failures. Within these four categories: bearing, stator, and rotor failure account for approximately 85% of all motor failures.

This percentage could be significantly reduced if the driven equipment was properly aligned when installed, and remained aligned regardless of changes in operating conditions. However, motors are often coupled to misaligned pump loads or loads with rotational unbalance and fail prematurely due to stresses imparted upon the motor bearings. Furthermore, manually detecting such fault causing conditions is difficult at best because doing so requires the motor to be running. As such, an operator is usually required to remove the motor from operation to perform a maintenance review and diagnosis. However, removing the motor from service is unsuitable in many industries because motor down-time is extremely costly and undesirable in many applications.

As such, some detection devices have been designed that generate feedback regarding an operating motor. The feedback is then reviewed by an operator to determine the operating conditions of the motor. However, most systems that monitor operating motors merely provide feedback of faults that have already damaged the motor. As such, though operational feedback is sent to the operator, it is usually too late for preventive action to be taken.

Some systems have attempted to provide an operator with early fault warning feedback. For example, vibration monitoring has been utilized to provide some early misalignment or unbalance based faults. However, when a mechanical resonance occurs, machine vibrations are amplified. Due to this amplification, false positives indicating severe mechanical asymmetry are possible. Furthermore, vibration based monitoring systems typically require highly invasive and specialized monitoring systems to be deployed within the motor system As such, other systems perform some signature analysis on feedback from the motor and attempt to detect deviations indicative of a fault. While these systems may aid the operator in maintenance reviews of an operating motor, they are typically invasive and require highly specialized sensors to monitor a specific motor application. That is, the detection devices are generally an autonomous unit with sensors that must be deployed around or within the motor. Therefore, the detection devices constitute another system that must be invasively deployed within the motor system and which is susceptible to faults and deterioration. Additionally, connecting these specialized sensors usually requires specialized tools, protective devices and/or clothing and highly skilled technicians because these sensors are intended to be deployed to energized parts. Accordingly, while traditional monitoring devices allow the operator to safely receive feedback regarding an operating motor, the devices present additional autonomous systems associated with the motor which must be set-up, monitored, and maintained. Therefore, traditional motor monitoring devices compound the cost of operating the motors.

Furthermore, such early fault warning feedback systems typically require multiple levels of configuration and tailoring to properly monitor a particular motor and that motor within a particular application. That is, such systems must be individually configured to a specific motor, load, and application. For example, applications such as motor driven fans and pumps are typically constant load applications. On the other hand, applications such as conveyers or material handling applications are typically varying load applications. Generally, traditional early fault warning feedback systems must be manually calibrated not only for the individual motor but also for the specific application within which the motor is operating. Therefore, traditional early fault warning feedback systems require considerable investments in time and engineering to deploy the system.

Additionally, these systems must be regularly recalibrated to reconfigure the system for normal operational changes to the motor, load, and/or application, else risk false positives or negatives arising from normal changes to the motor signature used for review. Such recalibrations must adjust for new load variances, changes to the motor-load configuration, changes in operational frequency, and new application variances, to name but a few. Therefore, while these early fault warning feedback systems may be capable of alerting an operator of required maintenance, the systems alone may require maintenance and corresponding downtime exceeding that of the monitored motor.

It would therefore be desirable to design a system and method to non-invasively perform diagnostics on an operating motor that is specific to that motor. Additionally, it would be desirable for the system and method to be implementable utilizing traditional motor systems in order to avoid introducing additional autonomous sub-systems. Furthermore, it would be desirable that the system and method be capable of proactively diagnosing conditions indicative of a wide range of potential faults including mechanical faults and cavitation faults and be able to alert an operator of an impending fault prior to an actual fault occurrence. Also, it would be advantageous that the system and method be capable of adjusting to a wide variety of motors, loads, motor signatures, and applications and be capable of dynamically adjusting to normal changes in the system over time.

BRIEF DESCRIPTION OF THE INVENTION

The present invention is directed to a system and method that overcomes the aforementioned drawbacks. Raw data is acquired from a plurality of sensors of a relay monitoring an operating motor. A baseline is dynamically generated to model the motor under known "healthy" conditions. Once the baseline is generated, the raw data within dynamically selected sidebands is processed and mapped to one of a plurality of load bins. Baseline data associated with the mapped bin is then compared to the processed data to generate a fault index indicative of potential faults for that particular operating motor. A proactive alert is then sent to an operator warning of a potential fault before any damage occurs.

In accordance with one aspect of the present invention, a power meter is disclosed including a housing and a plurality of sensors configured to monitor operation of a motor. A processor is disposed within the housing and configured to receive operational feedback from the plurality of sensor and proactively determine an operational wellness of the motor from the operational feedback.

In accordance with another aspect of the present invention, an overload relay is disclosed that includes a relay housing and a power meter disposed within the relay housing and configured to receive data from a motor and perform motor fault protection. A wellness system is disposed within the housing and configured to review the data and proactively determine a wellness of the motor to generate condition based maintenance alerts.

In accordance with yet another aspect of the present invention, a kit is disclosed that is configured to retrofit a relay. The kit includes a housing having dimensions substantially similar to an overload relay and an interface configured to receive feedback from a plurality of sensors monitoring a motor. A wellness system is disposed within the housing and configured to receive the feedback from the interface and determine whether preventative maintenance is required on the motor.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 15 is a graph of motor power spectra with varying levels of misalignment operating without cavitation.

FIG. 16 is a graph motor of power spectra with varying levels of misalignment operating under cavitation.

DETAILED DESCRIPTION OF THE PREFERRED EMBODIMENT

The present invention is related to the detection of abnormal conditions to predictively determine potential motor faults. Current signature analysis (CSA) or power signature analysis (PSA) is utilized to review raw data received from a plurality of sensors of a relay monitoring an operating motor. The system, which is disposed within the relay, maps raw data within dynamically selected sidebands to a bin and generates a fault signature index from a comparison of the raw data to baseline data associated with the mapped bin. An operator of the monitored motor system is then proactively alerted of a potential fault prior to a fault occurrence.

Figure 1:
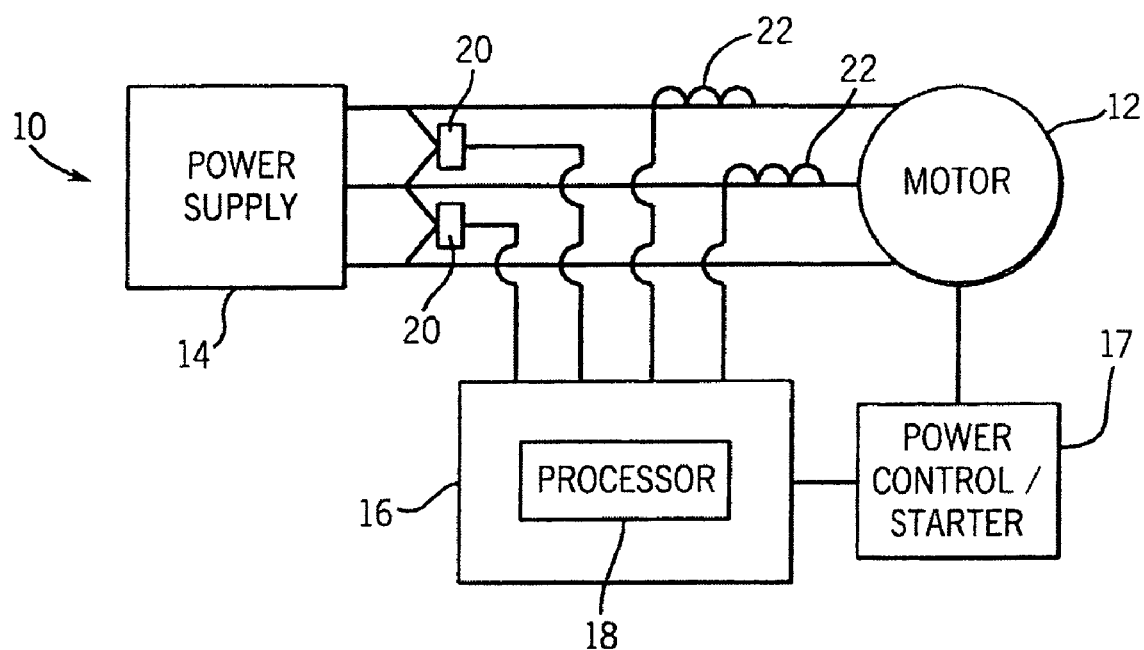
FIG. 1 is a schematic representation of a motor assembly in accordance with the present invention.

Referring now to FIG. 1, a motor assembly such as an induction motor configured to drive a pump is shown. The motor assembly 10 includes a motor 12 that receives power from a power supply 14. The motor assembly 10 also includes a relay assembly 16 used to monitor as well as control operation of the motor in response to operator inputs or motor fault conditions. The motor 12 and the relay assembly 16 typically are coupled to electronic devices such as a power control/start 17 in series with the motor supply to control power to the motor 12. The relay assembly 16 includes a processor 18 that, as will be described in greater detail with respect to FIG. 2, implements an algorithm to determine the presence of unwanted mechanical conditions and predictively alert an operator of a potential fault before a fault occurs. The relay assembly 16 further includes at least a pair of voltage sensors 20 and a pair of current sensors 22. As is generally known, voltage and current data may be acquired from only two of the phases of a three-phase motor as voltage and current data for the third phase may be extrapolated from the voltage and current data of the monitored two phases. While the present invention will be described with respect to a three-phase motor, the present invention is equivalently applicable to a two-phase and a single-phase motor.

Figure 2:
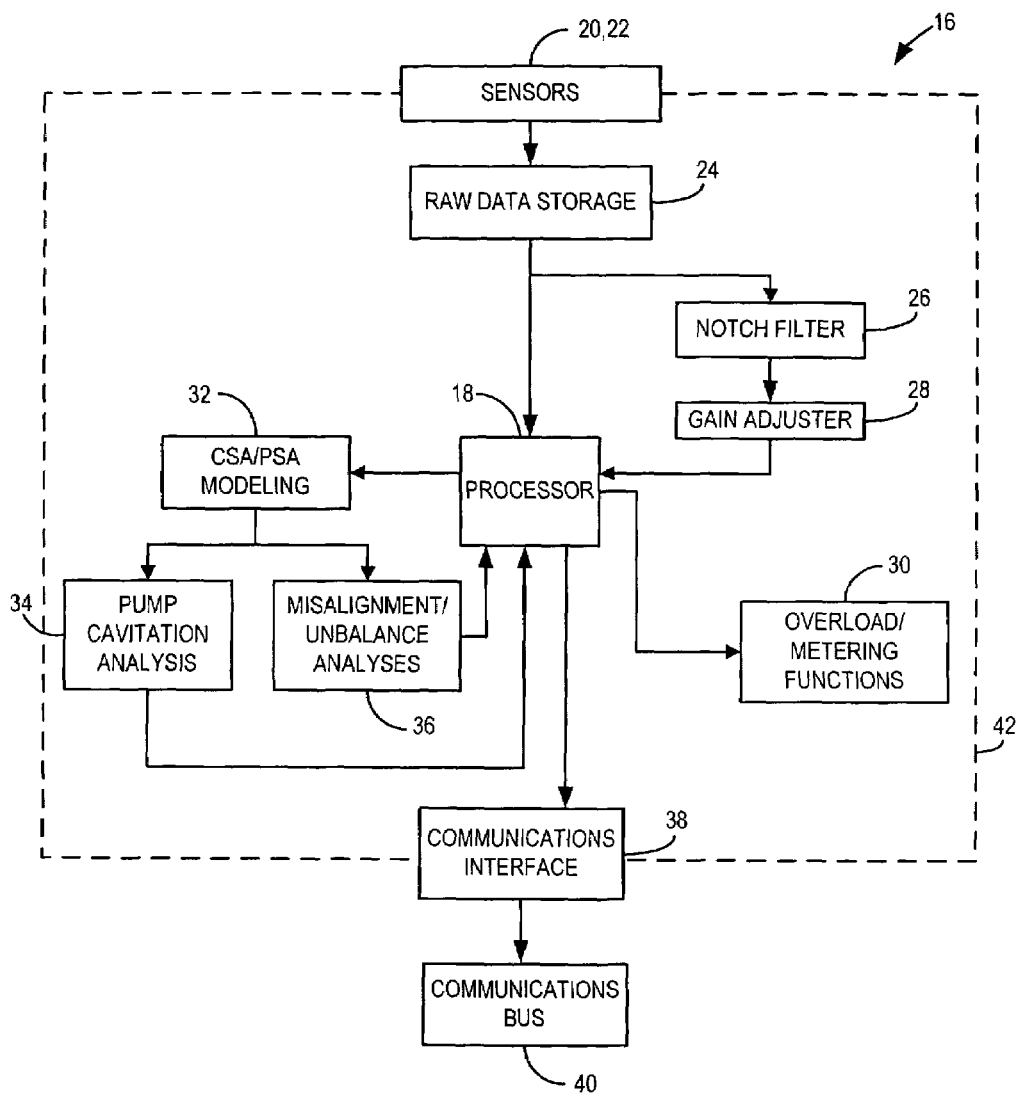
FIG. 2 is block diagram of a relay system in accordance with the present invention.

Referring now to FIG. 2, a more detailed block diagram of the relay assembly 16 of FIG. 1 is shown. As stated with respect to FIG. 1, the relay assembly 16 includes a processor 18 and sensors 20, 22. Furthermore, the relay assembly 16 includes a raw data storage 24, a notch filter 26, and a gain adjuster 28. As will be described in detail with respect to FIGS. 17, 19, and 20, these systems 24, 26, 28, operate to receive the raw data generated by the sensors 22, 24 and prepare the raw data for processing by the processor 18. However, as will be described, some raw data may also be passed to the processor 18 for functions such as traditional overload protection and metering. That is, it should be recognized that the relay assembly 16 includes a system capable of performing both traditional relay functions as well as wellness functions. As a further example, relay may be configured to perform motor start or stop functions, perform trip and reset functions, or monitor motor phase current and thermal capacity.

Specifically, the processor 18 is configured to control at least two distinct functionalities including traditional overload and metering functions 30 and current signature analysis (CSA)/power signature analysis (PSA) functions 32 for wellness based monitoring based on pump cavitation 34 and misalignment unbalance 36. Current signature analysis and PSA involve analysis via a fast Fourier transform (FFT) of motor currents or instantaneous power to identity equipment or system abnormalities. As will be described in detail, this approach involves comparison of a known "good" current or power signatures recorded during normal operation to the actual running current or power signature. The known "good" current or power signature is stored as a model 32. The model is then compared during at least one of a pump cavitation analysis 32 or misalignment/unbalance analysis 36 performed by the processor 18. Cavitation of a pump, such as a centrifugal pump, occurs when the pump's inlet static pressure drops below the liquid vapor pressure, which substantially increases the probability of pump and/or motor failure.

The relay assembly 16 also includes a communications interface 38 for connection to a communications bus 40 of a traditional communications system associated with the motor being monitored. Therefore, as will be described in greater detail with respect to FIG. 26, the communications interface 38 is designed to integrate the relay assembly 16 with existing communications systems such that the relay assembly incorporates seamlessly into the existing communications system and no additional or proprietary communications system is necessary. That is, should the processor 18 detect operation of the motor deviating from the current signature or power signature model 32, within a user prescribed tolerance, a proactive alert is sent via the communications interface 38 onto the communications bus 40. Therefore, the communications interface 38 is designed to allow the communication of the proactive alerts to an operator without the need for any additional communications infrastructure.

Therefore, the relay assembly 16 operates as a motor wellness relay that performs condition based monitoring (CBM) that is non-invasive in nature and also operates as a traditional overload/metering relay. The motor operation is not disturbed while raw data collection and processing occurs. Additionally, all systems and components necessary for the predictive fault detection technique, as will be described in detail below, are integrated within a relay housing 42. The relay assembly 16 is only marginally larger than traditional relays that are incapable of sophisticated predictive fault detection. Due to the size of the relay assembly 16, the relay assembly is immediately retrofittable into existing systems utilizing traditional solid-state relays without predictive fault detection. For example, critical process applications such as boiler feed pumps, may benefit from additional diagnostic capabilities of the relay assembly 16, enabling operators to schedule maintenance based on the sensed condition of the equipment before an impending failure occurs. Since the relay assembly 16 is approximately the size of traditional relay, the relay assembly 16 may be configured as a kit that is able to readily replace any existing relay that may be configured to monitor such a boiler feed pump. It is contemplated that the relay assembly 16 may be useable with a wide variety of motors having various horsepowers (HP) and a variety of poles.

Figure 3:
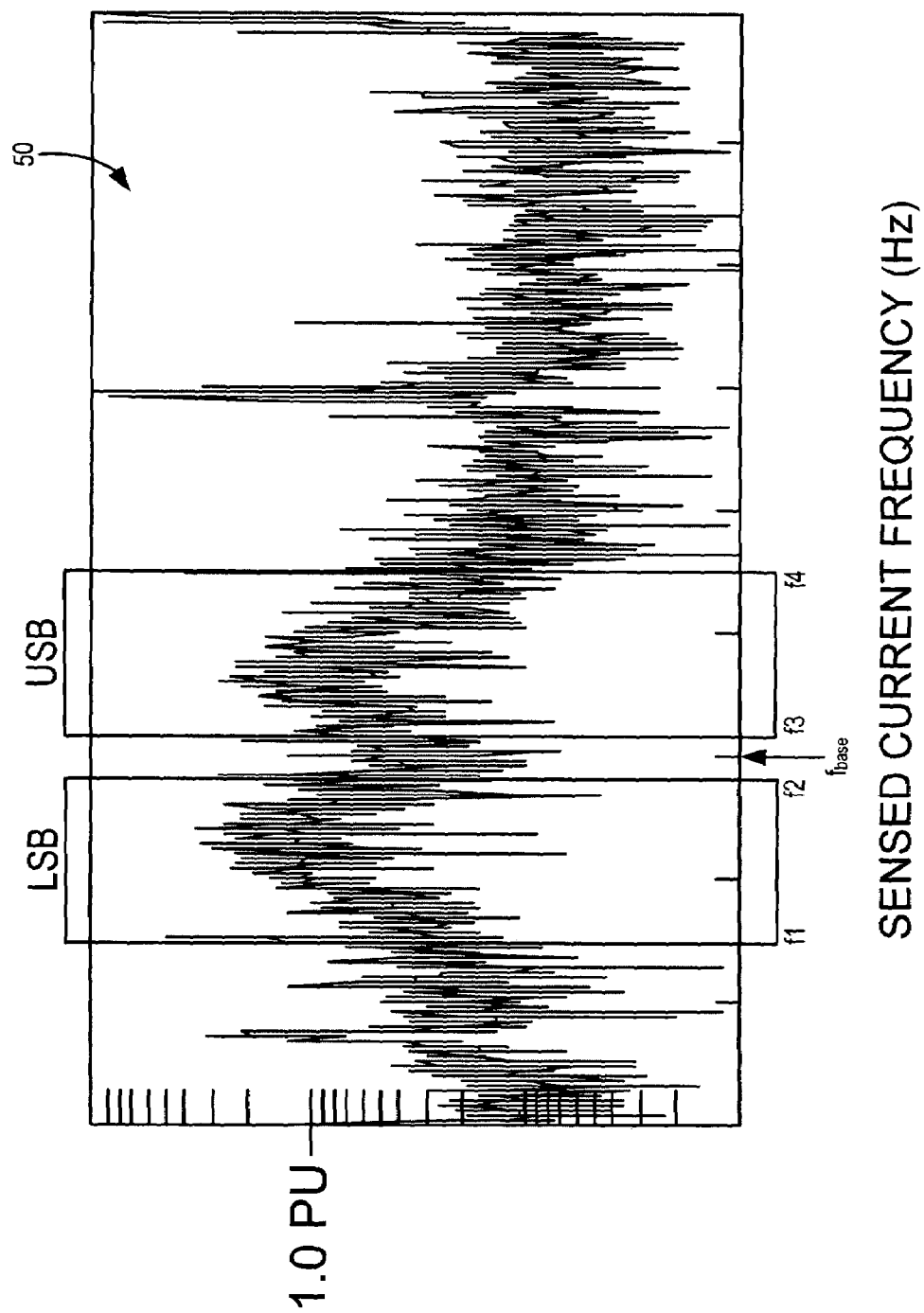
FIG. 3 is a graph illustrating a per unit motor current versus frequency of a motor under normal operation.
Figure 4:
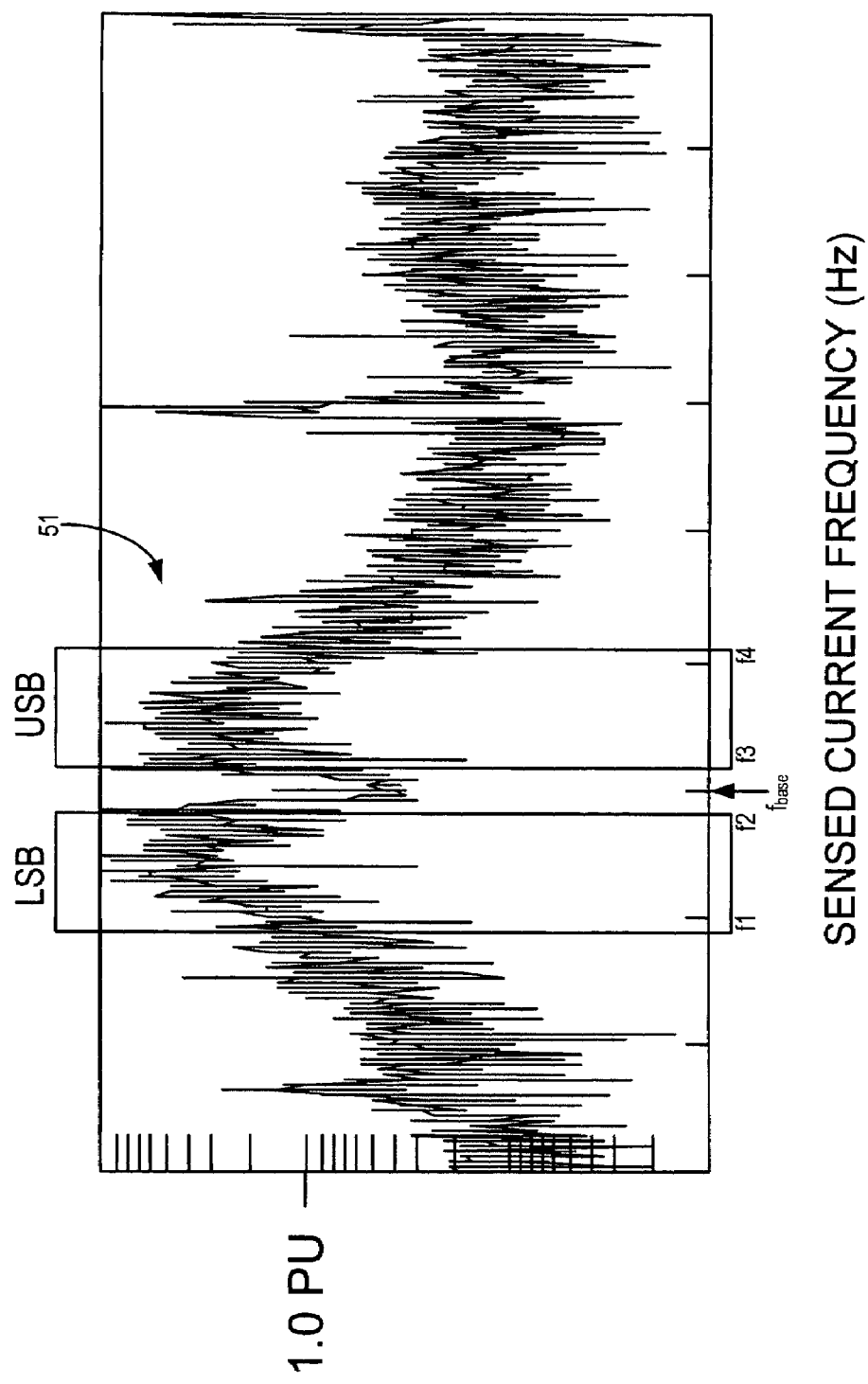
FIG. 4 is a graph illustrating a per unit motor current versus frequency of a motor operating in cavitation as identified in accordance with the present invention.

Referring now to FIG. 3, a graph illustrating a sensed per-unit motor current versus frequency of a motor under normal operation, such as could be determined by the relay assembly 16 of FIG. 2, is shown. Multiple consecutive FFT processings, preferably four, of the raw data are performed and averaged to produce a relatively stable current signature 50. For example, a motor driving a centrifugal pump may have been monitored during normal operation to produce a current signature such as shown in FIG. 3. Accordingly, a trace for the same motor and centrifugal pump, this time with the pump operating in a cavitation state, could produce a current signature such as shown in FIG. 4. FIG. 4 shows that there is a measurable difference in motor current spectrum 51 compared to the current signature 50 of the pump operating in a normal state, as shown in FIG. 3. Specifically, the cavitation, as well as other mechanical faults, can produce certain noise patterns and specific frequency components in the motor current spectrum, which are used for fault indication or signature. However, the specific noise patterns differ greatly from motor to motor or from one operating environment to another. Additionally, mechanical forces resulting from potential fault conditions are typically highly dependent on the rotational speed of the motor. Therefore, accurate detection of a noise pattern indicative of a potential fault can be difficult while avoiding false positives and negatives. As will be described, false positives and negatives are avoided by using CSA and/or PSA and tailoring the analysis to an individual motor through the use of dynamically adjusted sidebands and load bins.

Referring again to FIGS. 3 and 4, the noise levels around the system frequency, designated $f_{base}$, are considerably higher for the cavitation mode illustrated in FIG. 4 as opposed to FIG. 3. As will be described, by reviewing the noise pattern in the current spectrum of the motor being monitored with respect to the system frequency in a defined range can aid in the determination of a predictive fault indicator signature. Two sidebands of the system frequency are defined to aid in detection, designated as the lower sideband (LSB) and the upper sideband (USB).

By integrating all noise energy in a frequency sideband extending from of f1 through f2 for the LSB and f3 through f4 for the USB around the system frequency and comparing data between FIG. 3 and FIG. 4, a potential or impending motor fault can be detected, as will be described. However, to avoid false positives and/or negatives due to variations in motors, a learning process is utilized to generate baseline data associated with a plurality of load bins for the comparisons that are specifically tailored to a particular motor. As will be described, the magnitudes of the frequency sidebands are not consistent for all load levels. For example, when detecting mechanical fault conditions, when there is mechanical resonance, the value of the summed frequency components within the sidebands will typically be higher than associated levels when resonance is not present. As will be described, the plurality of load bins compensates for load related abnormalities and resonance by classifying load levels into bins and calculating a specific baseline for each load bin.

Integration of the noise energy within the LSB and USB can be an arithmetic sum for all frequency components in each respective sideband. It is also contemplated that an averaged value can be used, which can be obtained by dividing the integration result by the number of noise components in the frequency sideband.

In a simplified manner and according to one embodiment, linear averaging around system frequency is achieved for pump cavitation detection according to:

$$\text{LSB: } E_L = \frac{1}{f_2 - f_1} \sum_{f=f_1}^{f_2} i(f), \quad \text{(Eqn. 1)}$$

$$\text{USB: } E_U = \frac{1}{f_4 - f_3} \sum_{f=f_3}^{f_4} i(f), \quad \text{(Eqn. 2)}$$

Whole energy integration:

$$E = E_L + E_U \quad \text{(Eqn. 3)},$$

where i(f) represents the noise components at defined frequencies within the frequency bins.

Figure 5:
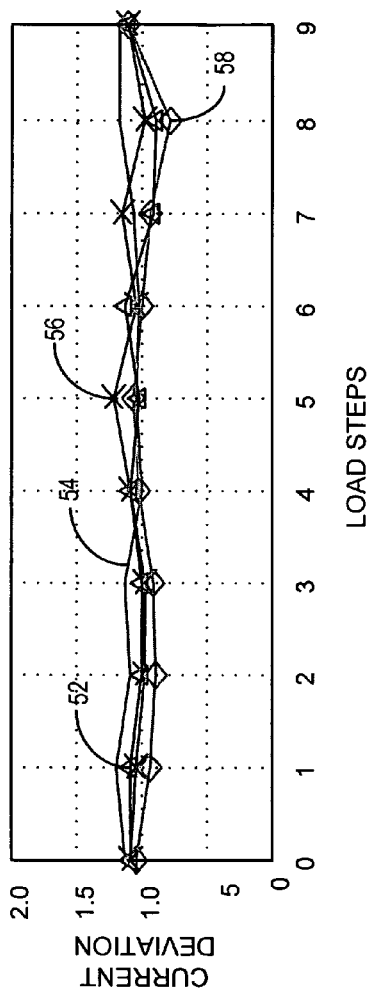
FIG. 5 is a graph illustrating linear averaging current values for a lower sideband range of a motor under normal operation.
Figure 6:
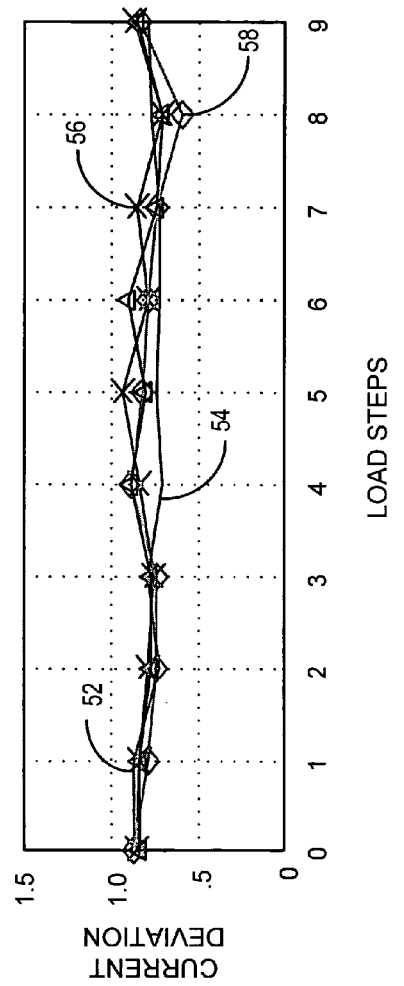
FIG. 6 is a graph illustrating linear averaging current values for an upper sideband range of a motor under normal operation.

FIGS. 5 and 6 show the results of the linear averaging values of the LSB and USB of FIG. 3, respectively, around a system frequency of 60Hz. Four traces 52, 54, 56, and 58 indicate different misalignment conditions at the various load points when operating without cavitation. From the traces 52–58, a baseline for known acceptable pump operation is generated. The four traces 52–58, represent different levels of parallel misalignment ranging from no misalignment in trace 52 to 30 mil of misalignment in trace 58. As can be discerned from the traces 52–58, all of the curves are relatively flat with respect to different loads and misalignment conditions. However, it should be noted that the current deviation for each trace 52–58 varies according to each load step, which could lead to false positive or negative fault indications. Therefore, as will be described, a plurality of load bins is utilized to alleviate the potential of false positives and negatives.

Figure 7:
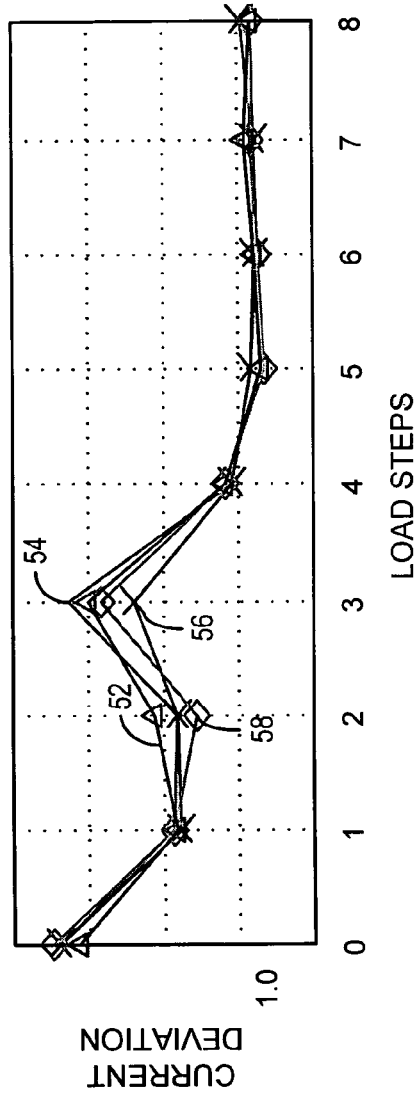
FIG. 7 is a graph illustrating linear averaging current values for a lower sideband range of a motor in cavitation as identified in accordance with the present invention.
Figure 8:
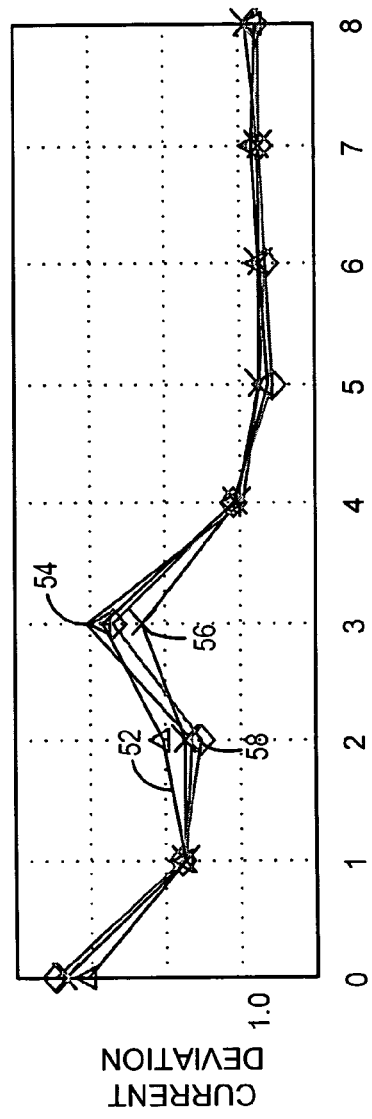
FIG. 8 is a graph illustrating linear averaging current values for an upper sideband range of a motor in cavitation as identified in accordance with the present invention.

Referring now to FIG. 7 and FIG. 8, the same load points are shown as in FIGS. 5 and FIG. 6, except that now the pump driven by the monitored motor is operating under cavitation at load points 1, 2, and 3. As can be seen in both FIG. 7 and FIG. 8, across the different levels of parallel misalignment in the Iraces 52–58, the noise integration values are significantly higher when compared to the baseline shown in FIGS. 5 and 6.

Figure 9:
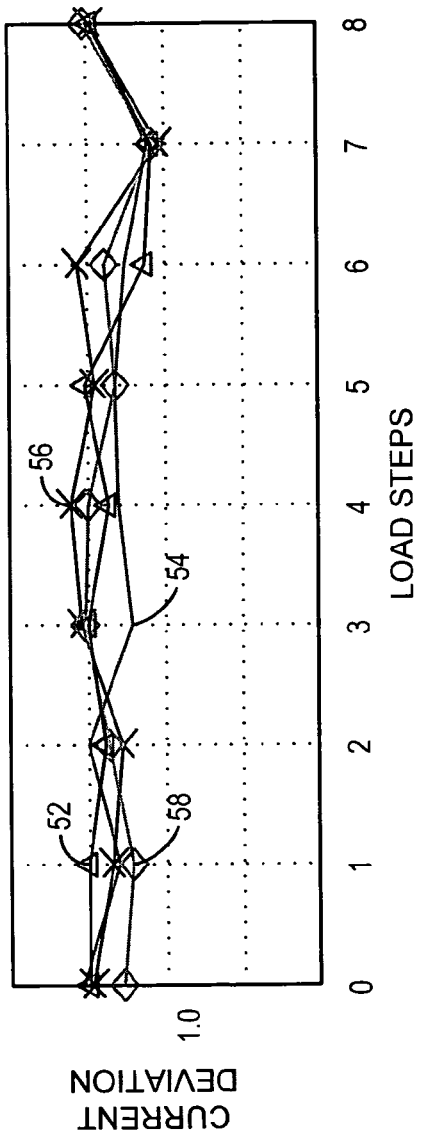
FIG. 9 is a graph illustrating instantaneous power values of a motor under normal operation.
Figure 10:
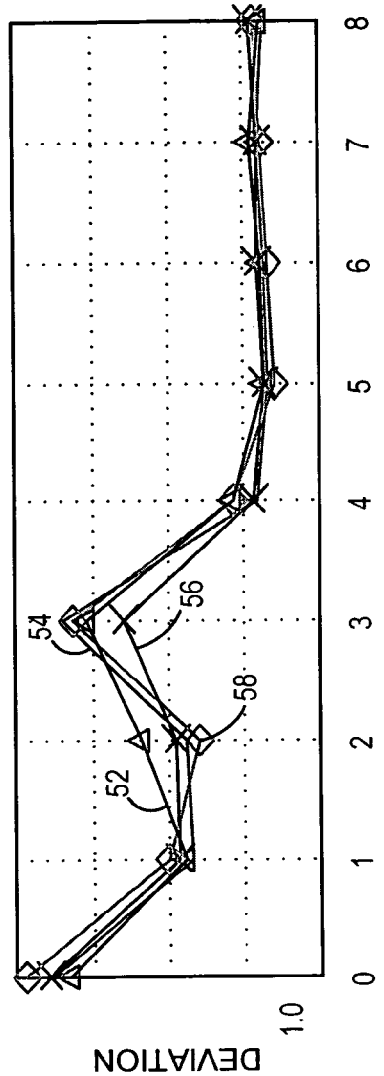
FIG. 10 is a graph illustrating noise within instantaneous power values of a motor indicating cavitation as identified in accordance with the present invention.

While FIGS. 5–8 illustrate the determination of cavitation within the current spectrum of a motor. FIGS. 9 and 10 illustrate the determination of cavitation within the instantaneous power of a motor. FIG. 9 shows a graph of integrated power spectra for a motor operating under normal conditions. On the other hand, FIG. 10 shows the integrated power spectra for the same motor when the pump is operating under cavitation, as shown at load points 0, 1, 2, and 3. As in the motor current, three-phase instantaneous motor power also contains spectra signature information relating to cavitation phenomena. As can be seen in FIGS. 9 and 10, similar results may he obtained for cavitation detection through instantaneous power as through current analysis, as in FIG. 3–8.

It should be noted that the major part of the instantaneous power is real motor power, which is a DC component, and all the other frequencies are left or right shifted within the spectra for the positive or negative components in terms of three-phase quantities. The cavitation noise sideband must be selected above DC frequency. Therefore, the noise band integration for cavitation detection may be accurately performed at a lower sideband frequency range compared to the current signature model. It should be noted that in motor voltage and current measurements, there are always some DC components in sampled data due to signal conditioning circuit errors. Therefore, a specially designed high pass filter is used to remove the unwanted DC components and its neighboring frequencies to assure the accuracy of the data.

Figure 11:
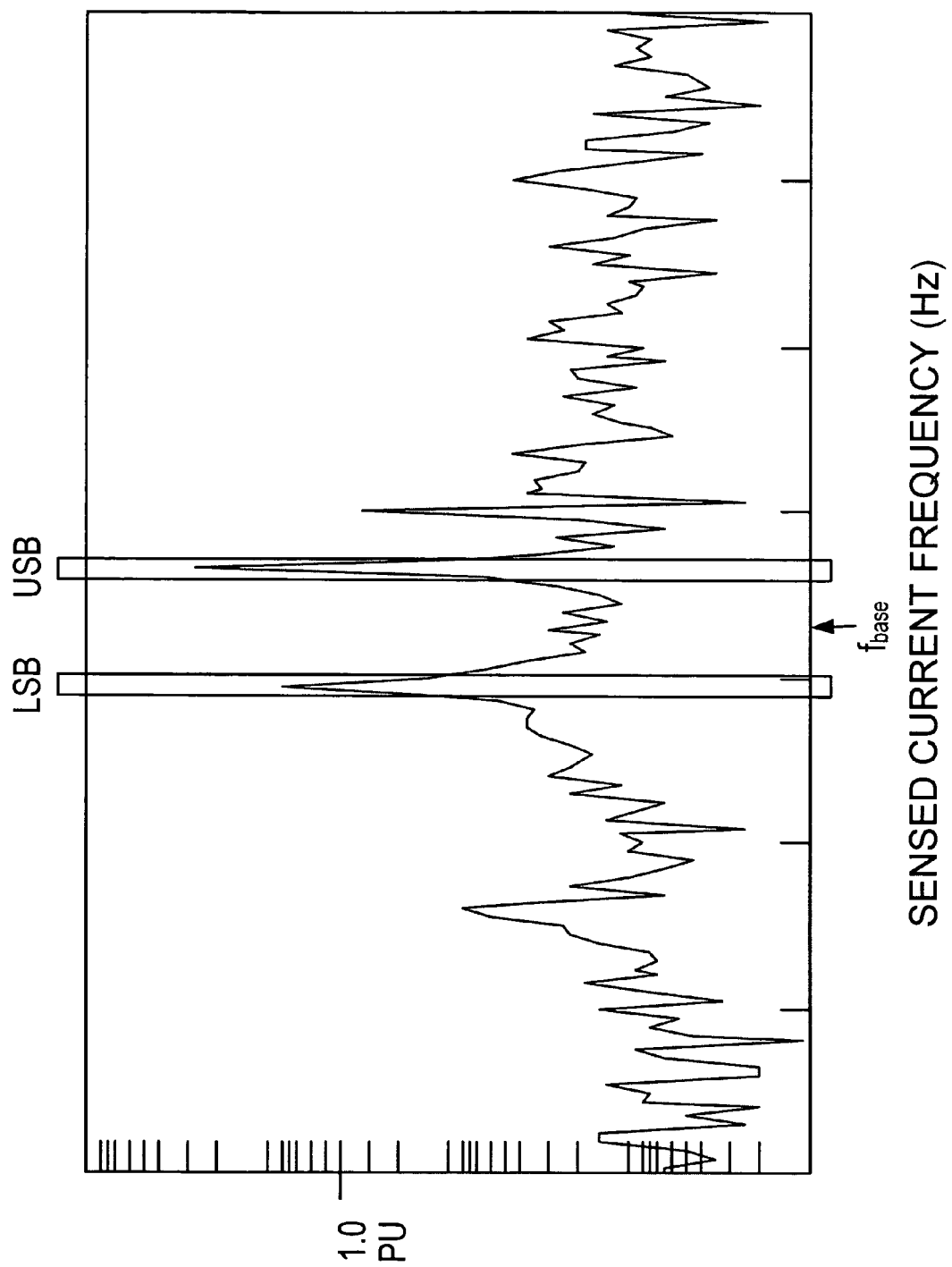
FIG. 11 is a graph of a per unit motor current versus frequency of a motor illustrating a current spectrum of motor shaft speed components.

Additional analysis may also be performed to predicatively detect motor faults resulting from misalignment or imbalance. Referring now to FIG. 11, a graph of per-unit motor current versus frequency of a motor illustrating a current spectrum of motor shaft speed components is shown. As will be shown, mechanical faults may be identified from motor shaft speed components. Mechanical faults are defined as unbalanced load or misalignment, including radial and angular misalignment. These faults can be detected by monitoring amplitude variances of specific shaft running speed components in the motor current spectrum. There are many shaft speed related components in the current spectrum. FIG. 11 shows a current spectrum of shaft speed related components around the base frequency ($f_{base}$) for a two-pole motor.

Specifically, sidebands, labeled LSB and USB are selected surrounding the running frequency of the motor within which the desired shaft running speed component amplitudes are reviewed. In a simplified manner and according to another embodiment, the frequency components are summed for mechanical fault detection according to:

$$\text{LSB: } E_L = \sqrt{\sum_{f=f1}^{f2} i(f)^2}, \quad \text{(Eqn. 4)}$$

$$\text{USB: } E_U = \sqrt{\sum_{f=f3}^{f4} i(f)^2}. \quad \text{(Eqn. 5)}$$

where i(f) is all the frequency components within the selected sideband. For mechanical fault detection $E_L$ and $E_U$ are then linearly averaged. It should be noted that the sidebands selected for cavitation fault detection and mechanical fault detection differ significantly. For example, it is not uncommon that a cavitation fault detection sideband may span approximately 15 Hz while a mechanical fault detection sideband may span approximately 2 Hz. Simply, as will be described, the sideband selection criteria for determining each fault type differs.

Figure 12:
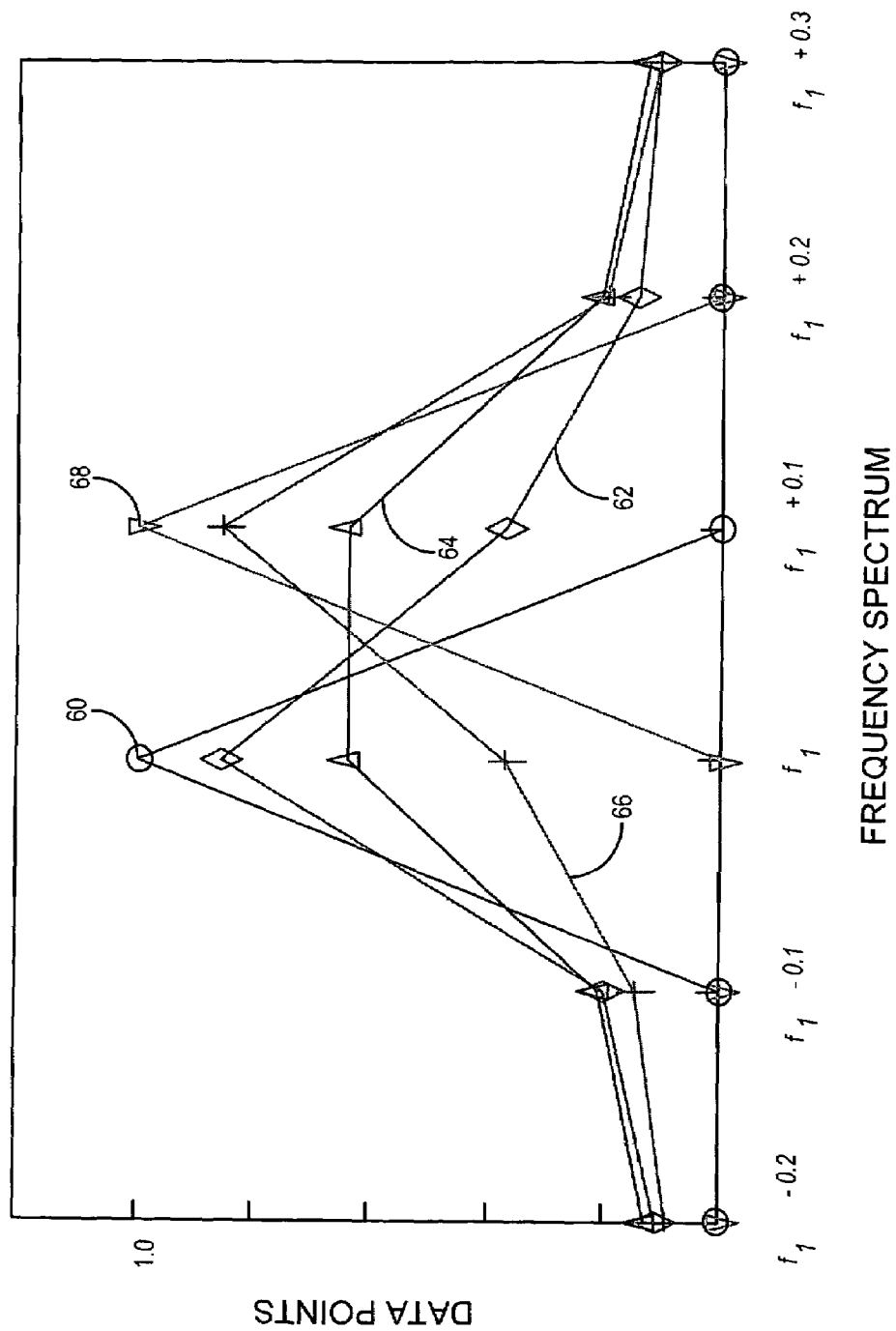
FIG. 12 is a graph illustrating an example of the influence of energy leakage within a current spectrum of a motor.

While FIG. 11 shows a current spectrum of shaft speed related components, accurately measuring the amplitude of a specific frequency component in the current spectrum may be hampered by energy leakage. That is, since an FFT resolution must be limited to maintain manageable data ranges, accurate representation of the acquired data may be difficult because not all frequency components accurately represent real amplitudes in the spectrum due to energy leakage. Accordingly, for those components with frequencies not at FFT resolution steps, amplitudes are smaller than their actual values. FIG. 12 illustrates an example of the influence of energy leakage in the current spectrum with 0.1 Hz resolution for signals with amplitude of unity (1) and frequencies including $f_1$ Hz, enumerated 60; $f_1$+0.03 Hz, enumerated 62; $f_1$+0.05 Hz, enumerated 64; $f_1$+0.07 Hz, enumerated 66; and $f_1$+0.1 Hz, enumerated 68. The amplitudes of signals with frequencies not at FFT resolution steps, for example, the signal at $f_1$+0.05 Hz 64, are less than unity (1) in the FFT spectrum.

In the motor current spectrum, frequencies of the interested shaft speed components could be any value around a harmonic of system frequency. In most cases, these components are not necessarily at FFT resolution steps and the amplitudes of these components are relatively small. Since mechanical fault detection is based on monitoring amplitude variances of specific shaft speed components, accurate amplitude estimation for these components is required.

Therefore, two techniques are contemplated to estimate the amplitude of shaft speed related components in the current spectrum. According to one embodiment of the invention, a square root of accumulated squared values for all points in the above-described narrow spectral sideband around the shaft speed component is calculated. According to this embodiment, a root sum square (RSS) value is calculated for all frequency components in a selected frequency band around the shaft speed frequency as an estimated value. A start and end frequency of the selected sideband in the current spectrum are used that cover the desired shaft speed component. To achieve improved estimation performance, a sideband is selected in a way that the interested shaft speed frequency is centered about this defined frequency band. Accuracy of this estimation depends on the size of the selected bin, such that the wider the selected bin, the more accurate the estimation. However, wider bin selection can result in errors in estimation if a major neighboring frequency component is close to or falls within the selected bin because the energy of this component will be accumulated in the summed value.

To overcome these inherent limitations in the RSS technique and in accordance with a preferred embodiment, the amplitude may be estimated by utilizing three consecutive points around the shaft speed component. In this case, polynomial estimation is used to estimate the shaft speed amplitude. For example, assuming $i_k$ is the interested shaft speed component and $i_k$+1 and $i_k$-1 are the next upper and lower neighboring components, then the estimated amplitude of shaft speed is given by:

$$\text{Ampl}=i_k+C\times|i_{k+1}-i_{k-1}| \quad \text{(Eqn. 6)},$$

where C is a constant selected based on the specific FFT resolution applied. Utilizing this technique renders improved estimation over the aforementioned RSS technique and only uses three consecutive frequency values. Therefore, the major neighboring frequency components close to the shaft speed frequency have little effect on estimated values.

Table I compares the performance of both amplitude estimation techniques to FFT results. Table I clearly shows that the FFT analysis yields the amplitude error due to energy leakage. Simply, the FFT amplitudes for each signal frequency are below unity (1). For example, the middle of the FFT steps ($f_1$+0.05 Hz) includes an error of 36.31%. On the other hand, the RSS estimation technique includes a significantly improved largest error of 3.41% at $f_1$+0.05 Hz. However, over the entire frequency spectrum, the polynomial estimation yields a largest error of only 0.279% at $f_1$+0.03 Hz. Therefore, the polynomial estimation technique achieves superior accuracy.

TABLE I

AMPLITUDE ESTIMATION SIMULATION RESULTS

| Signal Frequencies (Hz) | FFT Amplitudes | RSS Estimations | Polynomial Estimations |
|---|---|---|---|
| $f_1$ | 0.999941 | 0.999941 | 0.999941 |
| $f_1$ + .01 | 0.98366 | 0.997289 | 1.00042 |
| $f_1$ + .02 | 0.935556 | 0.989701 | 1.00169 |
| $f_1$ + .03 | 0.85839 | 0.9795 | 1.00279 |
| $f_1$ + .04 | 0.756677 | 0.970364 | 1.0022 |
| $f_1$ + .05 | 0.636817 | 0.965892 | 0.997572 |
| $f_1$ + .06 | 0.757035 | 0.969236 | 1.00195 |
| $f_1$ + .07 | 0.8585 | 0.977782 | 1.00272 |
| $f_1$ + .08 | 0.93564 | 0.988217 | 1.00175 |
| $f_1$ + .09 | 0.983535 | 0.996648 | 1.00051 |
| $f_1$ + .1 | 0.999941 | 0.999941 | 0.999941 |

Figure 13:
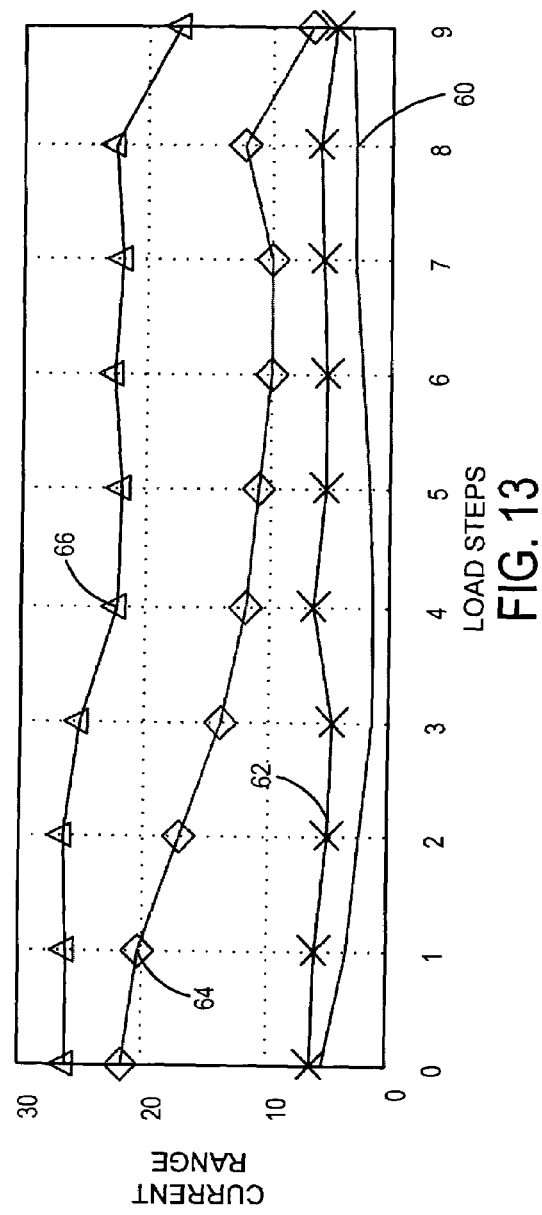
FIG. 13 is a graph of motor current spectra with varying levels of misalignment operating without cavitation.
Figure 14:
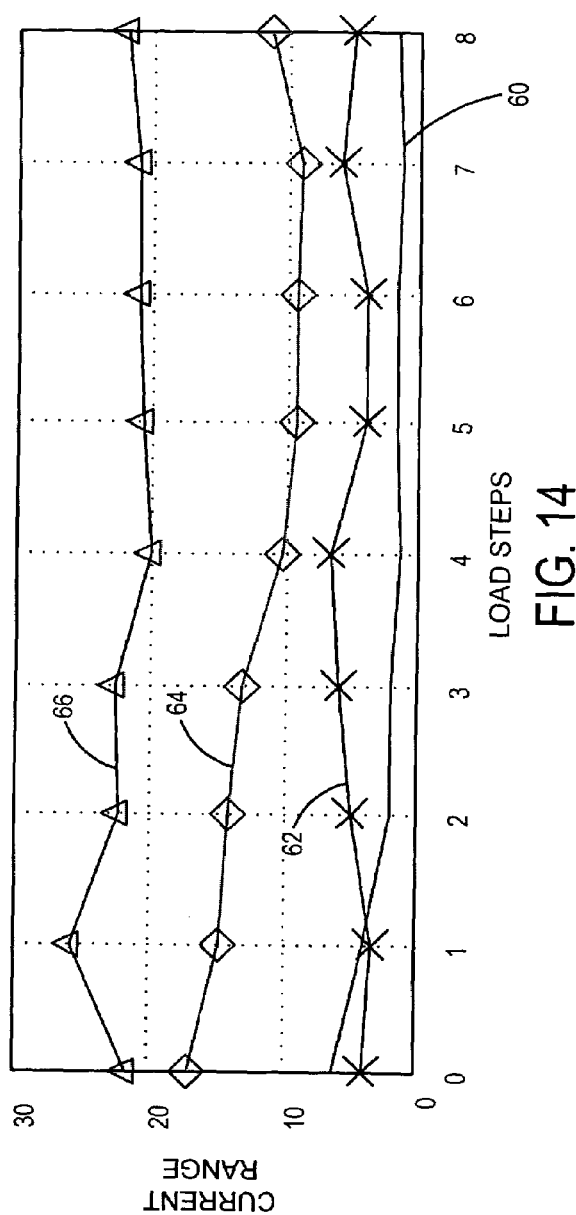
FIG. 14 is a graph of motor current spectra with varying levels of misalignment operating under cavitation.

Thus, unbalanced motor loads or misalignments, including radial and angular misalignment, can be detected by monitoring amplitude variances of specific shaft running speed components in the motor current spectrum within carefully selected sidebands. The above-described polynomial estimation technique is preferred to compensate for energy leakage. FIG. 13 and FIG. 14 show results using the polynomial estimation technique for multiple motors including various levels of misalignment with and without cavitation, respectively, using the motor current spectra. Specifically, the four traces 60–66 indicate different misalignment conditions including no misalignment at trace 60, 10 mils of misalignment at trace 62, 20 mils of misalignment at trace 64, and 30 mils of misalignment at trace 66 at various load steps. Similarly, FIG. 15 and FIG. 16 illustrate the derivation of similar results for the identification of radial misalignment with and without cavitation, respectively, using the power spectrum.

As is apparent from FIGS. 15 and 16, the motor power analysis yields fault indicators for all corresponding load levels and fault conditions that are comparable to the notched current analysis illustrated in FIGS. 13 and 14. It should be noted that as the load varies from load step 0 to load step 9, the current range of the motor varies significantly. For example, trace 64 of FIG. 13 begins at a summed sideband current of greater than 20 at load step 0 and drops to a summed sideband current of less than 10 at load step 9. Accordingly, as will be described, a plurality of load bins is used such that the summed sideband data at a given load is compared to baseline data at a corresponding load. The load bins allow detection even though the spectral components associated with conditions indicative of potential mechanical faults do not always linearly change as the load varies. For example, mechanical resonance in the coupled systems may affect the spectral components to increase drastically; however, the plurality of load bins and dynamically selected sidebands alleviate the potential for false positives arising from these conditions.

It should be recognized that obtaining accurate results using the instantaneous power spectra requires the removal of the DC component inherent in the system voltage and current of the motor. If the DC component in voltage and current measurement is not removed, there will be a large fundamental component in the power spectrum. Accordingly, if the system frequency varies and deviates from FFT steps, there will be a significant FFT energy leakage, which will raise all the neighboring frequency component levels. In some cases, this energy leakage may be so significant that it buries the useful shaft speed component. In this case, detection of the shaft speed component becomes difficult or impossible. Therefore, as will be described, a filter is used to remove this DC component.

Figure 17:
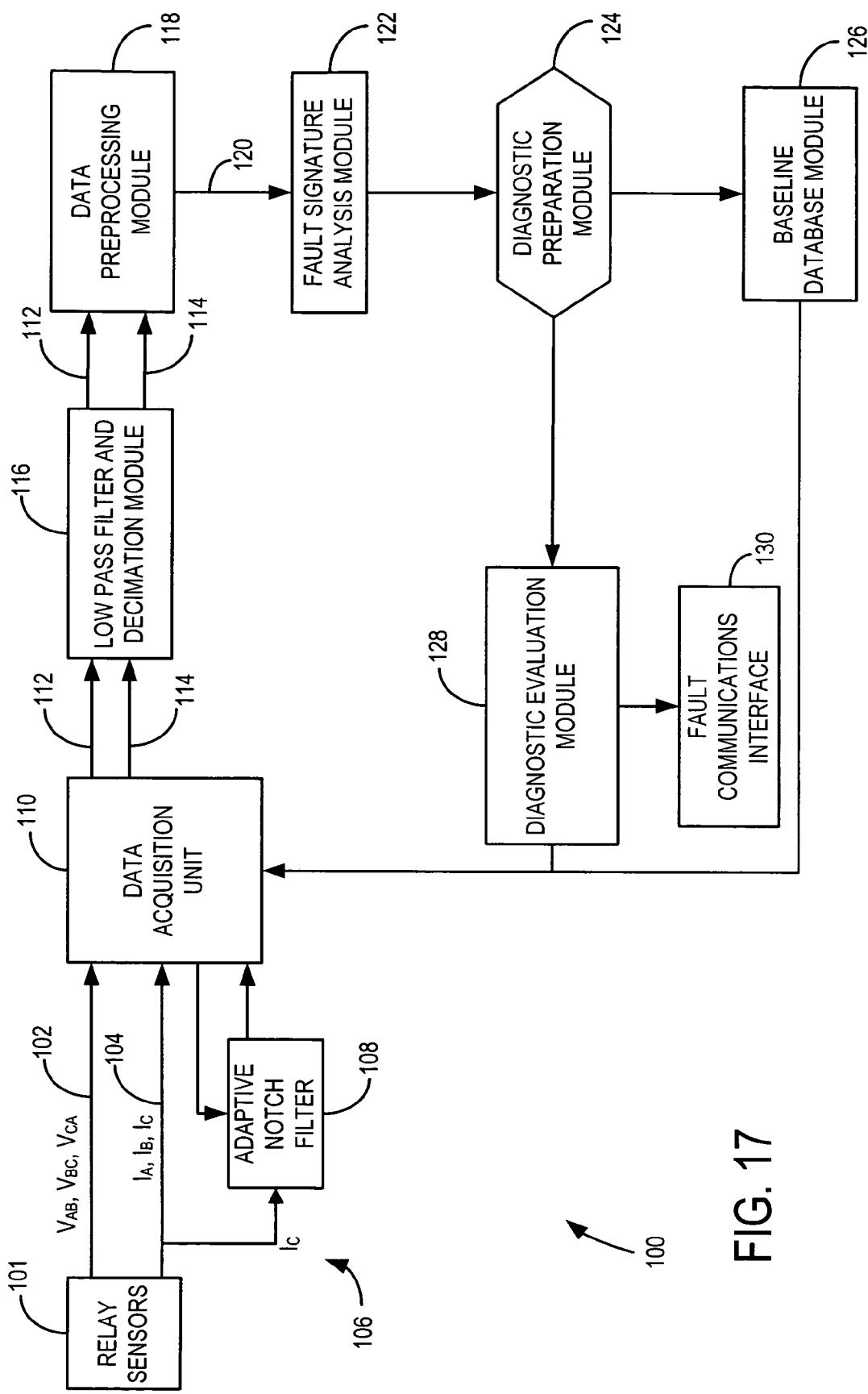
FIG. 17 is a block diagram illustrating an overview of a technique for predictive fault detection in accordance with the present invention.

FIG. 17 is a block diagram of a system 100 utilized to implement a technique for predictive fault detection in accordance with the present invention. Before describing the system 100, it should be recognized that while the blocks of the system 100 will be described as modules, all processing is performed by the relay processor 18 of FIG. 2. Therefore, though described as independent modules, the steps performed by the modules are accomplished by the relay processor 18 of FIG. 2.

Referring now to FIG. 17, a plurality of relay sensors 101 is configured to monitor the operation of a motor and generate voltage data 102 and current data 104. In accordance with a preferred embodiment, at least one phase 106 of the current data 104 is adaptively filtered by a notch filter 108 to derive desired current data. All data 102–106 is passed to a data acquisition unit 110 to derive the necessary power sensing module data including voltage and current measurements, as well as instantaneous power computations. The data acquisition unit 110 passes the three-phased power data 112 and notched current data 114 to a low pass filter module 116. The low pass filter module 116 serves to cut off frequencies below 120 Hz as well as anti-alias and decimate the notched current data 114. After filtering, the data 112, 114 is passed to a data processing module 118 that computes a mean power from the three-phase power data 112 to check load conditions and transients within the mean power. If the load and the transients are above a threshold, the processing module 118 performs an FFT on the notched current data 114 and calculates a running average for the current spectrum and power.

After data processing by the processing module 118, the processed data 120 is passed to a fault signature analysis module 122 to generate a motor fault signature. As will be described in greater detail with respect to FIGS. 19 and 20, a cavitation fault signature (CFS) and/or mechanical fault signature (MFS) are calculated to determine the overall wellness of the motor.

To generate the CFS, the fault signature analysis module 122 calculates a median filtered frequency spectrum and then accumulates all spectrum components in sidebands within the frequency spectrum based on motor parameters, specifically, a system frequency ($f_s$). The sidebands are defined with respect to the $f_s$. For example, the lower sideband may range from $f_s-25$ Hz to $f_s-5$ Hz and the upper sideband may range from $f_s+25$ to $f_s+5$. The components with the sidebands are then summed as previously described. The fault signature analysis module 122 then saves this value as the CFS.

To generate the MFS, the fault signature analysis module 122 determines sideband ranges within the frequency spectrum based on motor parameters. In accordance with a preferred embodiment, the sidebands are selected such that:

$$f_{sideband} = |k*f_e \pm m*f_r| \quad \text{(Eqn. 7)},$$

where $f_r$ is the rotating frequency of the motor, and k and m are integers selected during configuration based on the motor parameters.

Once the sidebands are selected, all spectrum components are summed within the sidebands to form the MFS. Specifically, the MFS is summed across all spectrum components ($i_k$) such that:

$$MFS = \sqrt{\Sigma i_k^2} \quad \text{(Eqn. 8)}.$$

Once calculated, the fault signature analysis module 122 then saves this value as the MFS.

The MFS and CFS are then prepared by a diagnosis preparation module 124. Specifically, the averaged power is mapped into one of a plurality of bins to determine a monitoring state of the system. In a preferred embodiment, there are seven load bins to allow for a wide data range. Additionally, each load bin may correspond to one of two states. The states correspond to whether the system is in a learning mode or a monitoring mode.

If the currently mapped bin state corresponds to the learning mode, the data is passed to a baseline module 126 to perform linear averaging on the CFS and MFS with previously stored baseline data for the selected load bin. Once the linear averaging is complete, the data is stored as a CFS baseline and an MFS baseline that is associated with the currently mapped load bin. The baseline module 126 then determines whether sufficient baseline data has been generated for the current load bin. Specifically, as will be described, if the baseline module 126 determines sufficient iterations have occurred to generate robust baseline data for the currently mapped load bin, the state of the associated load bin is switched to the monitoring mode, else, the load bin remains in the learning mode. In either case, raw data is again acquired 110 and the system reiterates.

On the other hand, if the currently mapped load bin corresponds to the monitoring state, the CFS and MFS are sent to a diagnostic evaluation module 128. The diagnostic evaluation module 128 compares the CFS and MFS to the baseline data corresponding to the currently mapped load bin. If either the CFS or MFS differs from the baseline data by greater than a threshold, a potential fault has been identified and a fault flag is communicated through a fault communication interface 130. However, as long as the CFS or MFS does not exceed the baseline data by greater than the threshold, the data acquisition unit 110 continues to gather data and the processing routine reiterates.

Figure 18:
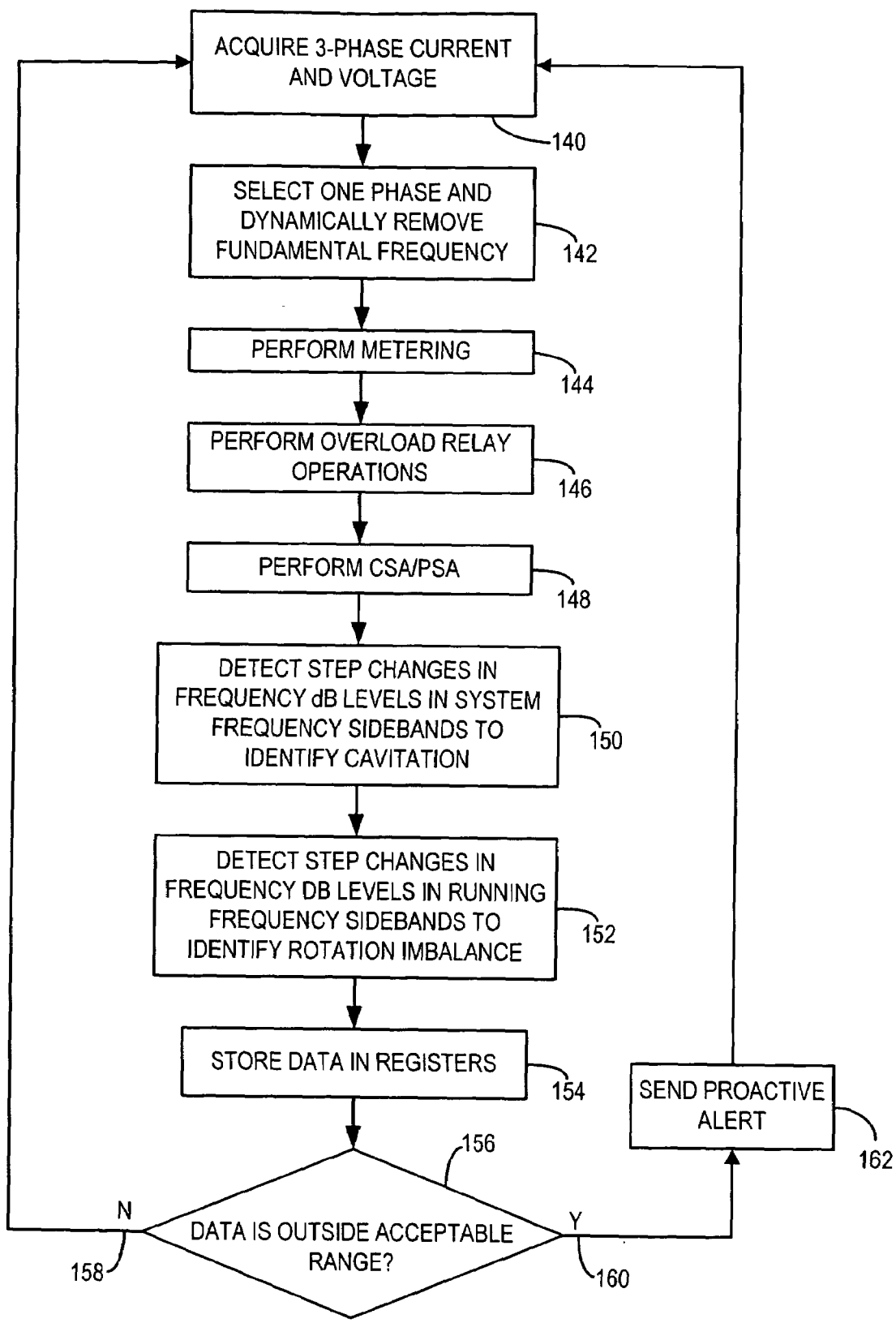
FIG. 18 is a detailed flow chart illustrating the steps of a technique for predictive fault detection in accordance with the present invention.

An overview of this process is illustrated in FIG. 18. Specifically, three-phase current and voltage data are received from relay sensors 140. One phase of the current data is selected and the fundamental frequency is dynamically removed 142. The technique continues by performing traditional motor metering functions 144 and overload relay operations 146 based on the data received 140. That is, it is contemplated that wellness monitoring and traditional relay functions, such as metering 144 and overload operation 146, may be performed on the same data. Therefore, the system acquires traditional relay-type data 140 to perform both traditional relay functions 144, 146 and the following wellness functions.

The data is then used to perform at least one of CSA and PSA to generate a CFS and/or MFS 148. The CFS is compared to a CFS baseline to detect step changes in frequency decibel (dB) levels within system frequency sidebands to identify motor operation under cavitation 150. The detailed steps of the process to identify motor operation under cavitation 150 will be described with respect to FIG. 19. Additionally, the MFS is compared to an MPS baseline to detect step changes in frequency dB levels in running frequency sidebands to identify mechanical faults 152. The detailed steps of the process to identify mechanical faults 152 will be described with respect to FIG. 20.

The results of the comparisons 150, 152 are then stored in registers for operator access 154. The stored data is then compared to an acceptable tolerance range 156 to determine whether the motor is operating outside the acceptable range, which is indicative of impending faults. If the data is not outside the acceptable range 158, the system reiterates and data acquisition from the relay sensors continues 140. However, if the data is outside the acceptable range 160, the relay sends a proactive alert 162 to indicate to an operator that the motor is operating under conditions of an impending mechanical fault or a cavitation fault and data acquisition from the relay sensors continues 140.

Figure 19:
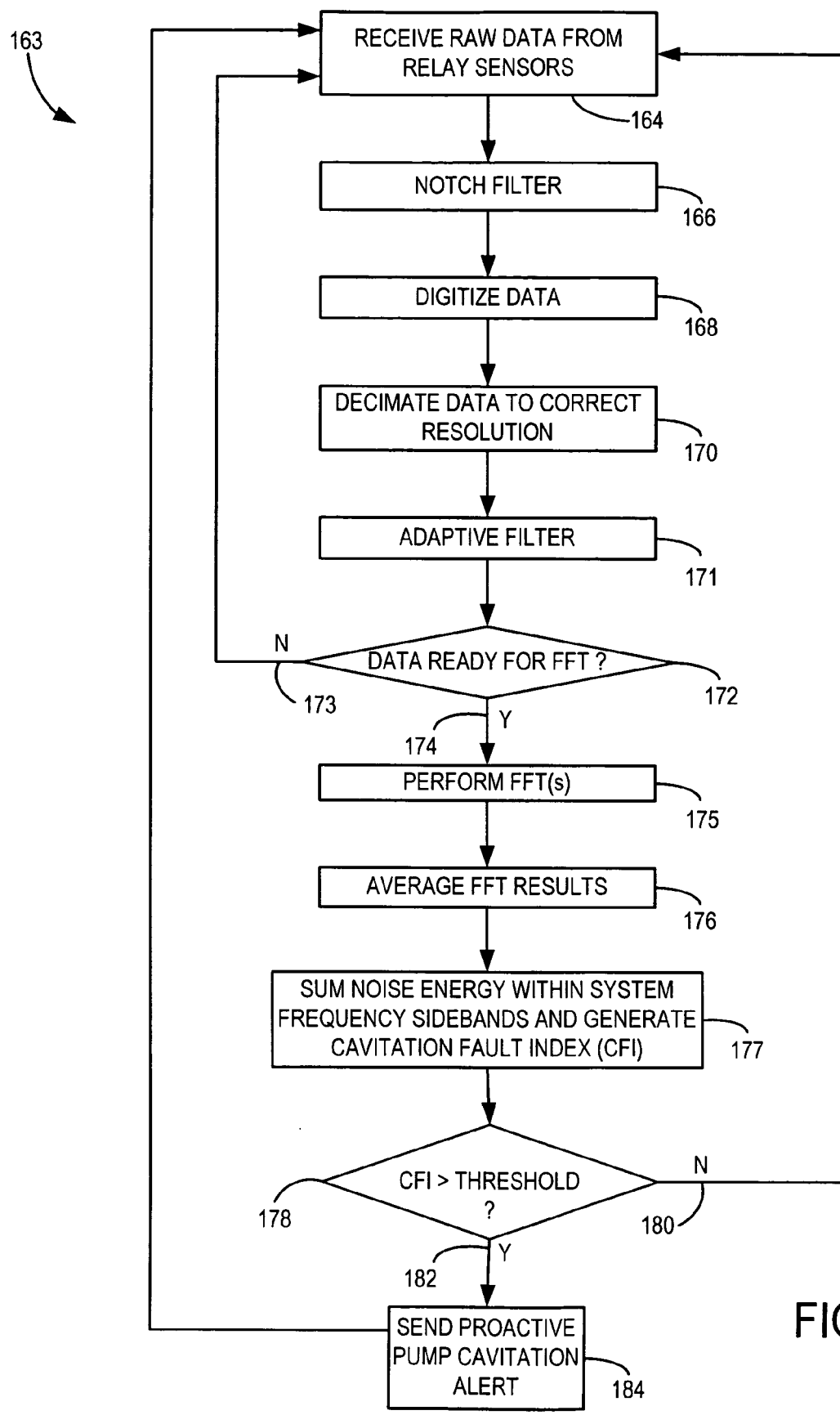
FIG. 19 is a flow chart illustrating the steps of a technique for predictive cavitation fault detection in accordance with the present invention.

Referring now to FIG. 19, the steps of a technique 163 for identifying pump cavitation are shown. This technique provides a pump/machine operator with an indication that the pump is operating in a reduced flow mode and/or is cavitating. The technique 163 begins by receiving raw data from the relay sensors 164. The inputs to the cavitation detection technique 163 are a "notched' current signal, the system frequency, and a real power measured in watts expressed as a percentage of full load. The cavitation identification 163 can conceptually be identified as having two major components. The first component is the data acquisition component. To implement the first component, the data is notch filtered 166 to maximize the fidelity of the data and subsequently digitized 168 for processing. The digitized data 168 is then decimated to acquire the correct resolution 170.

Specifically, the acquisition component is responsible for notch filtering and applying a decimation filter to the "notched" current signal. Decimation is required so that a high-resolution frequency spectrum of input signal over the bandwidth of interest can be computed with a reasonable length FFT. Since the effects that cavitation produces in the motor current can be quite small (less than 1% of the magnitude of the fundamental frequency component), false positive detections of cavitation could result from small increases to the signal noise floor. The signal noise floor may vary over time due to any number of environmental factors and/or normal aging of a motor (e.g. bearing wear). In attempt to avoid false positive detections, the acquisition component will filter the "notched" current signal with an adaptive digital comb filter 171 that adjusts nulls based on the system frequency to further remove the fundamental and any harmonics present in the signal. As will be described, if in a learning mode, it is contemplated that an RMS of the output of the adaptive filter may be computed as an estimate or averaged with baseline for use by the upcoming monitoring component of the cavitation technique 163.

However, if not in the learning mode, the monitoring component of the cavitation technique 163 is then initiated. The monitoring component takes the output of the acquisition component and attempts to determine if the data that was acquired is of sufficient quality to make an estimate of the cavitation fault index. As a basic conditions that must be satisfied by the input data to the cavitation detection algorithm, the data must be relatively stable during the entire FFT analysis period 172. To determine whether the signal is sufficiently stable 172, the decimated notch samples are applied to a module that computes statistics on the samples. The statistics are compared to predetermined threshold(s) to detect significant jumps in the signal statistics and identify the existence of outliers. If statistical abnormalities are detected 173, the data is not used for further processing by the cavitation detection technique, the technique reiterates, and new data is acquired 164. However, if no jumps or outliers are identified the data frame will be used 174 to compute a cavitation fault index measurement through an FFT 175.

Specifically, once stable data has been approved 174, the monitoring component computes the magnitude spectrum of the decimated notch current using an FFT algorithm 175. In accordance with a preferred embodiment, a plurality of FFTs, preferably at least four, is then performed on the data 175. The cumulative magnitude spectrum is then updated with the new data through a power estimate computed by summing the cumulative magnitude spectrum over the frequency range of interest and averaging 176. The average FFT results 176 are then used to produce a sum of noise energy within sidebands of the system frequency of the motor being monitored. For example, for a motor with a system frequency of 60 Hz, sidebands are selected on either side of the 60 Hz frequency range and the frequency components within the side bands are summed to form a cavitation fault signature which is compared to the baseline data 177. From this comparison, a cavitation fault index is computed as the ratio of the energy in the frequency sidebands of the new spectrum divided by the energy in the frequency sidebands of interest previously accumulated during a learning period (baseline) 177.

The radio of summed noise energy to baseline data (cavitation fault index) is then compared to a threshold to determine whether it deviates from the threshold 178. The threshold is particular to the motor and may be input by the operator, dynamically generated simultaneously with the baseline data, or predetermined such as from a lookup table. If the cavitation fault, index is not greater than the threshold 180, no condition indicative of future motor faults due to pump cavitation has been detected, and the system continues to receive raw data from the relay sensors 164. However, it the cavitation fault index is greater than the threshold 182, the system automatically sends a proactive pump cavitation alert 184 to alert the operator that a condition has been detected that indicates an impending fault due to pump cavitation.

The above-described cavitation detection technique is applicable to three-phase induction motor driven pumps. The diagnostic function is accomplished via spectral analysis of the notched motor current signal acquired from the motor terminal currents by traditional relay sensors. No other or additional instrumentation beyond that which is found is a relay is required.

Figure 20:
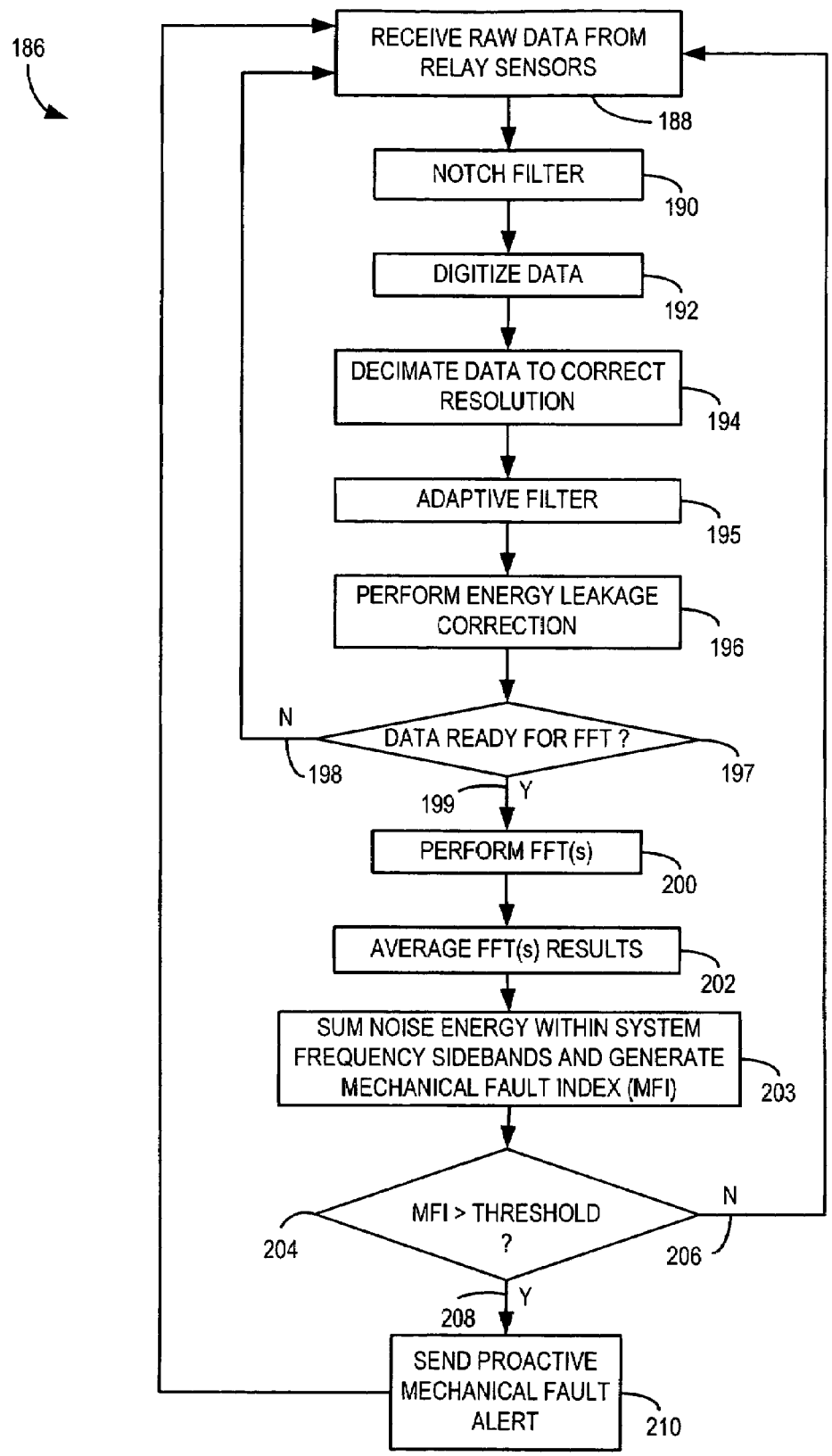
FIG. 20 is a flow chart illustrating the steps of a technique for predictive mechanical fault detection in accordance with the present invention.
Figure 21:
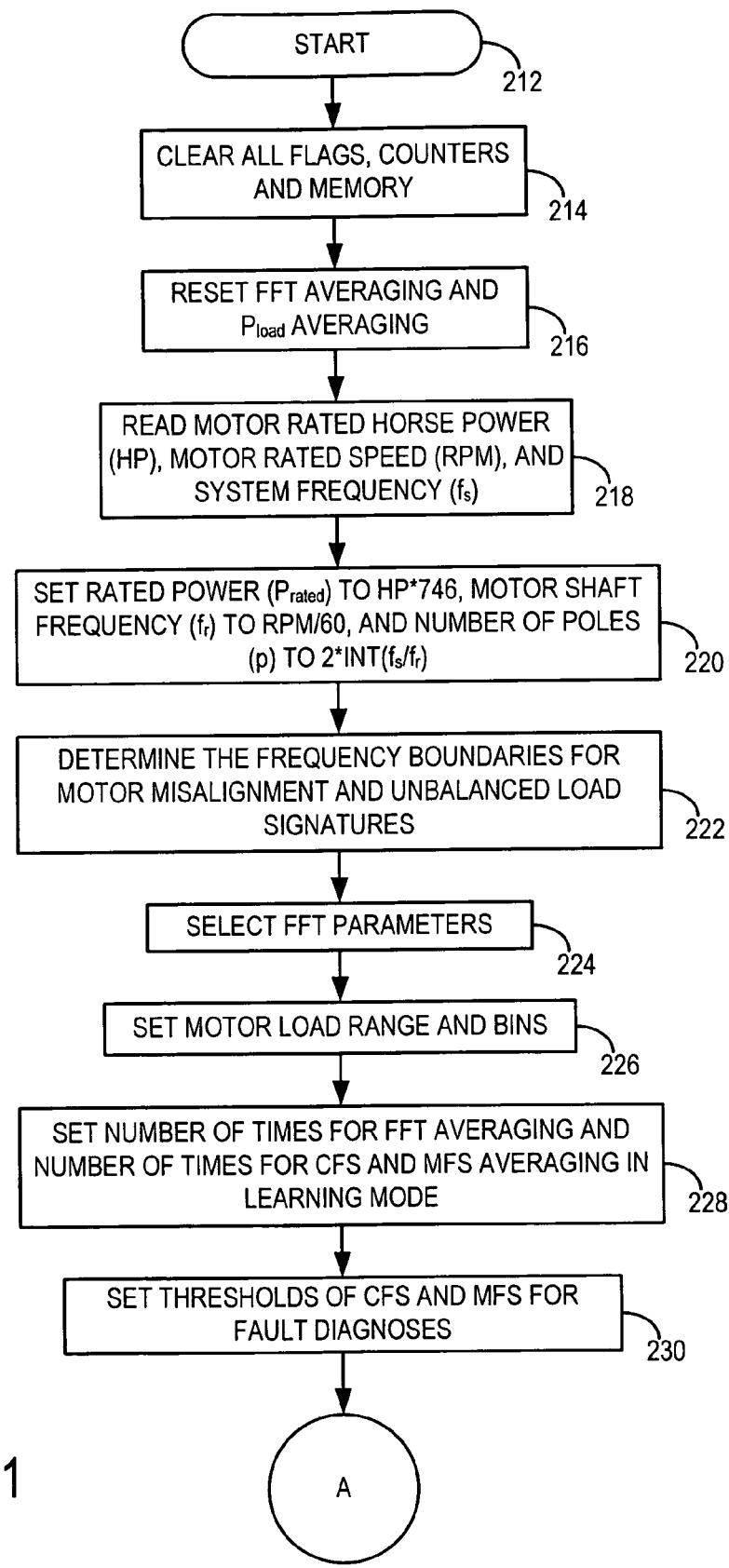
FIG. 21 is a more detailed flow chart illustrating the steps of a technique for predictive fault detection in accordance with the present invention.

Referring now to FIG. 20, the steps of a technique 186 for determining conditions indicative of impending mechanical faults are shown. Before describing the technique, it should be noted that the amplitude of the spectral sidebands when detecting mechanical faults are more dependent on the loading of the motor. With no-load, the spectral sidebands are quite high even on a well-aligned motor. These peaks are due to the inherent machine and instrumentation asymmetries unique to each installation of a motor system. As the load increases, these spectral peaks are dampened. When loaded, as the degree of misalignment increases, the amplitude of the sidebands also increases. Therefore, it is noted that that the motor should be loaded above 50% and that the monitoring of the spectral sidebands is done on a per load basis.

As in the cavitation detection technique described with respect to FIG. 19, the misalignment identification technique 186 can conceptually be identified as having two major components. The first component is the data acquisition component. The inputs to the misalignment detection technique 186 are the same "notched' current signal, system frequency, and real power 188 used for cavitation detection. The data acquisition component is responsible for notch filtering and applying a decimation filter to the "notched" current signal 190. Digitizing 192 and decimation 194 are required so that a high-resolution frequency spectrum of input signal over the bandwidth of interest can be computed with a reasonable length FFT. Since the effects that misalignment produces in the motor current can be quite small with respect to the fundamental frequency of the motor, false positive detections of impending mechanical faults could result from small increases to the signal noise floor. The noise floor may vary over time due to any number of environmental factors and/or normal aging of a motor due to the learning capabilities of the wellness model. In an attempt to avoid false positive detections, the acquisition component will filter the "notched" current signal with an adaptive digital comb filter 195 that adjusts nulls based on the system frequency to further remove the fundamental and any harmonics present in the signal.

As previously described, energy leakage correction 196 is performed such that the real portions of the necessary components of the frequency spectrum of the data are properly discernable. Then, following correction for energy leakage 196, the technique 186 attempts to determine if the data that was acquired is of sufficient quality to make an estimate of the misalignment fault index. One of the basic conditions that must be satisfied by the input data to the misalignment detection algorithm is that the data is relatively stable during the entire FFT analysis period 197. To determine whether the signal is sufficiently stable 197, the decimated notch samples are applied to a module that computes statistics on the samples. The statistics are compared to predetermined threshold(s) to detect significant jumps in the signal statistics and identify the existence of outliers. If statistical abnormalities are detected 198, the data is not used for further processing by the misalignment detection technique, the technique reiterates, and data is reacquired 188. However, if no jumps or outliers are identified the data frame will be used 199 to compute a misalignment fault index measurement through a FFT 200.

It is contemplated that an RMS of the output of the adaptive comb filter may be computed as an estimate of or averaged with the baseline for use by the upcoming monitoring component of the misalignment technique 186. If the system is not in a learning mode, once stable data has been approved 199, the monitoring component computes the magnitude spectrum of the decimated notch current using an FFT algorithm 200. In accordance with a preferred embodiment, a plurality of FFTs, preferably at least four, is performed on the data 200. The cumulative magnitude spectrum within the desired sidebands is then updated with the new data through an estimate computed by summing the cumulative magnitude spectrum over the frequency sideband ranges of interest and averaging 202. That is, the average FFT results 202 are then used to produce a sum of noise energy within sidebands of the system frequency of the motor being monitored, called a mechanical fault signature. This mechanical fault signature is then compared to the baseline to determine a deviation therefrom 203. As will be described in detail below, this number is referred to as the mechanical fault index 203.

The mechanical fault index is then compared to a threshold to determine if the mechanical fault signature deviates significantly from the baseline data by greater than the threshold 204. If not 206, the system continues to receive and process raw data 198. However, if the variances do significantly deviate from the baseline data by greater then the threshold 208, the system sends a proactive mechanical fault alert 210 to indicate that the system has detected conditions indicative of impending mechanical faults such as motor unbalance or misalignment.

Therefore, above-described impending mechanical fault detection technique provides a pump/machine operator with an indication that the pump and motor shaft are misaligned. The technique is applicable to three-phase induction motor driven pumps. The diagnostic function is accomplished via spectral analysis of the notched motor current signal acquired from the motor terminals by relay sensors. No other or additional instrumentation beyond the relay is required.

Referring now to FIGS. 21–24, the technique described with respect to FIGS. 18–20 is shown in greater detail. The technique begins in an initialization state 212 where all flags, counters, and memory are first cleared 214. Specifically, flags are cleared, counters are set to zero, and any previous CFS and MFS baseline buffers are cleared 214. Then, any previously stored FFT averaging and $P_{load}$ averaging are cleared 216. The system then reads the rated horsepower (HP), rated motor speed (RPM), and system frequency ($f_s$) 218. Using this data 218, the system calculates the rated motor power ($P_{rated}$), the shaft frequency ($f_r$), and the number of poles of the motor (p) 220. Specifically, $P_m$ is set equal to the HP * 746, $f_r$ is set equal to the RPMs/60, and p is set equal to twice the whole quotient of $f_s/f_r$. The system then determines the frequency boundaries for motor misalignment and unbalanced load signatures 222. That is, the frequency boundaries are set as follows:

$$F_{upper} = (1 - 0.4/p) * f_s + 1.2 * f_r - 0.1 \quad \text{(Eqn. 9)},$$

$$F_{lower} = (1 + 0.4/p) * f_s - 1.2 * f_r + 1 \quad \text{(Eqn. 10)},$$

The system then selects the FFT parameters 224, including a number of points for each FFT iteration ($N_{FFT}$) and decimation factors as well as the specific FFT resolution desired. In accordance with a preferred embodiment of the invention, the FFT resolution is selected to be equal to the quotient of $f_s/N_{FFT}$. The system then sets the motor load range and the number of load bins to be divided over the monitored load range 226. Specifically, the system identifies the motor load range to be monitored and divides the monitored load range into an even number of load bins. The system then sets the number of iterations for FFT averaging and the number of iterations for CFS and MFS averaging in learning mode 228. As the final step of initialization, the system sets thresholds for CFS and MFS fault diagnoses 230. It is contemplated that these thresholds may be either user defined, motor parameter selected, or predefined within the relay programming such as through a lookup table. Once the initialization is complete the system continues to the monitoring algorithm which will be described with respect to FIGS. 22–24.

Figure 22:
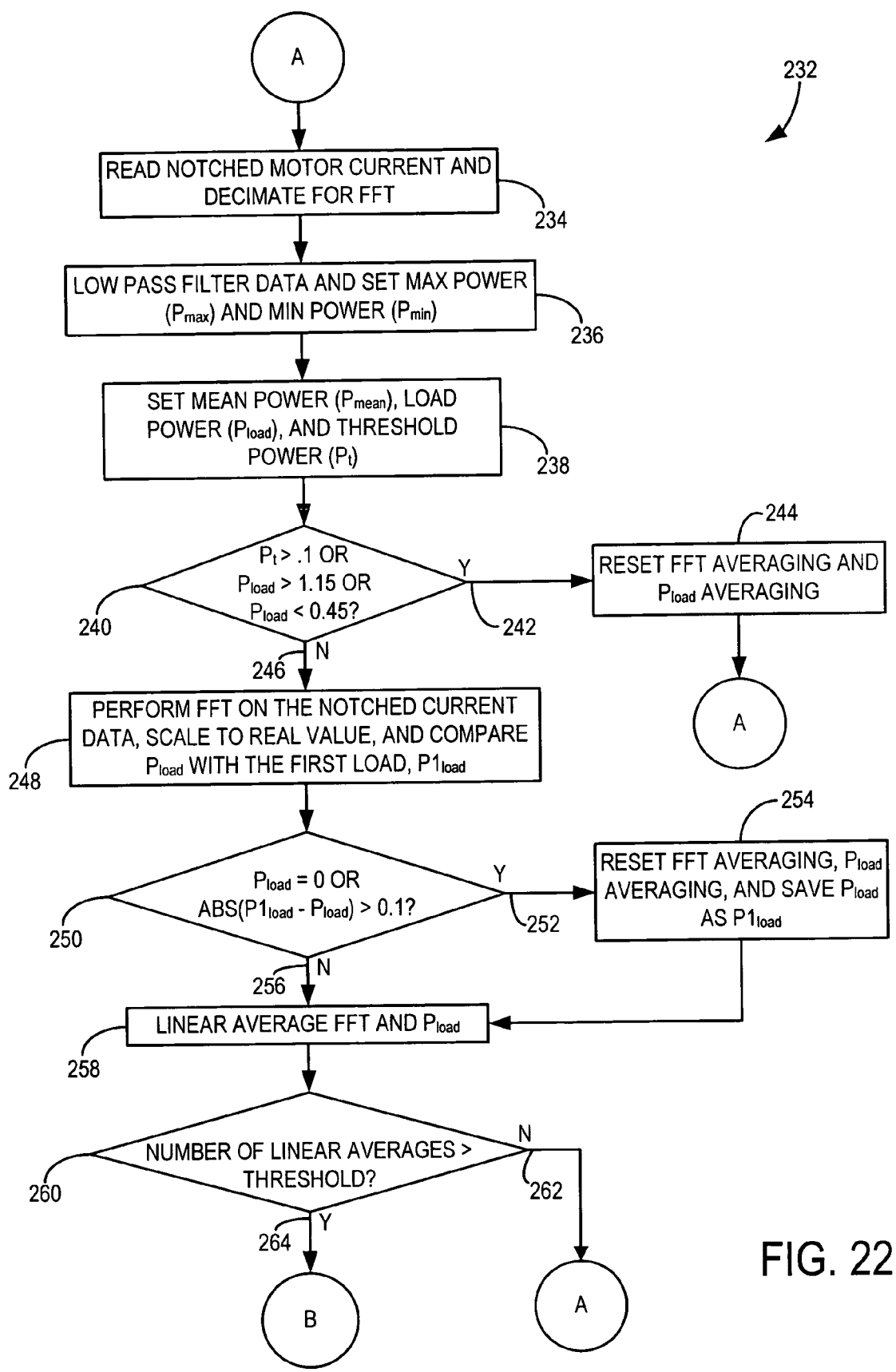
FIG. 22 is a continuation of the flow chart of FIG. 21 illustrating the steps of a technique for predictive fault detection in accordance with the present invention.

Referring to FIG. 22, a portion of a monitoring algorithm 232 in accordance with the present invention is shown. The monitoring algorithm 232 begins by reading the notch-filtered motor current and decimating the current data in preparation for FFT 234. Substantially simultaneously, the system monitors motor power, low pass filters the motor power data, and sets a maximum power ($P_{max}$) and a minimum power ($P_{min}$) 236. That is, traditional relay-type power metering is performed and the data received during the metering is subjected to a low pass filter that removes frequencies above 20 Hz. Also, for each FFT frame, $P_{max}$ and $P_{min}$ are set. Following these initial steps of power metering 236, power characteristic calculations, including a mean power calculation ($P_{mean}$), a load power calculation ($P_{load}$), and a transient power calculation ($P_t$). are all performed 238. That is, $P_{mean}$, $P_{load}$, and $P_t$ are calculated as follows:

$$P_{mean} = \frac{1}{N} \sum_{i=1}^{N} p(i), \quad \text{(Eqn. 11)}$$

$$P_{load} = P_{mean}/P_{rated} \quad \text{(Eqn. 12),}$$

$$P_t = \frac{P_{max} - P_{min}}{P_{rated}}. \quad \text{(Eqn. 13)}$$

Following the power characteristics calculations 238, $P_t$ is checked to determine whether it is greater than 0.1. Then $P_{load}$ is checked to determine whether it is greater than 1.15. Additionally, $P_{load}$ is checked to determine whether it is less than 0.45. All three checks are performed at step 240. If any of these conditions are true 242, FFT averaging and $P_{load}$ averaging are reset 244 and the monitoring algorithm restarts. However, if the determinations are all negative 246, then an FFT is performed on the notched current data, which is scaled to a real value (approximately a 0.1 Hz resolution, rectangular window), and $P_{load}$ is compared to the first data point within the power data ($P1_{load}$) 248. A comparison is then made to determine whether $P1_{load}$ is equal to zero or whether the absolute value of $P1_{load}$ less $P_{load}$ is greater than 0.1 at step 250. If either condition is true 252, FFT averaging and $P_{load}$ averaging are reset and $P_{load}$ is saved as $P1_{load}$ at step 254. However, if both conditions are negative 256, the system bypasses the reset of the FFT averaging and $P_{load}$ averaging and performs linear averages on the FFT data and $P_{load}$ data 258. A determination is then made as to whether such a linear average has been completed a sufficient number of times 260 and, if not, 262 the monitoring algorithm 232 reiterates. Specifically, a count of linear averaging iterations is compared to a threshold value. In a preferred embodiment, the threshold value is at least 6 so that robust averaging is completed. If the linear averaging has been completed the minimum number of times 264, the monitoring algorithm continues as will be described with respect to FIG. 23.

Figure 23:
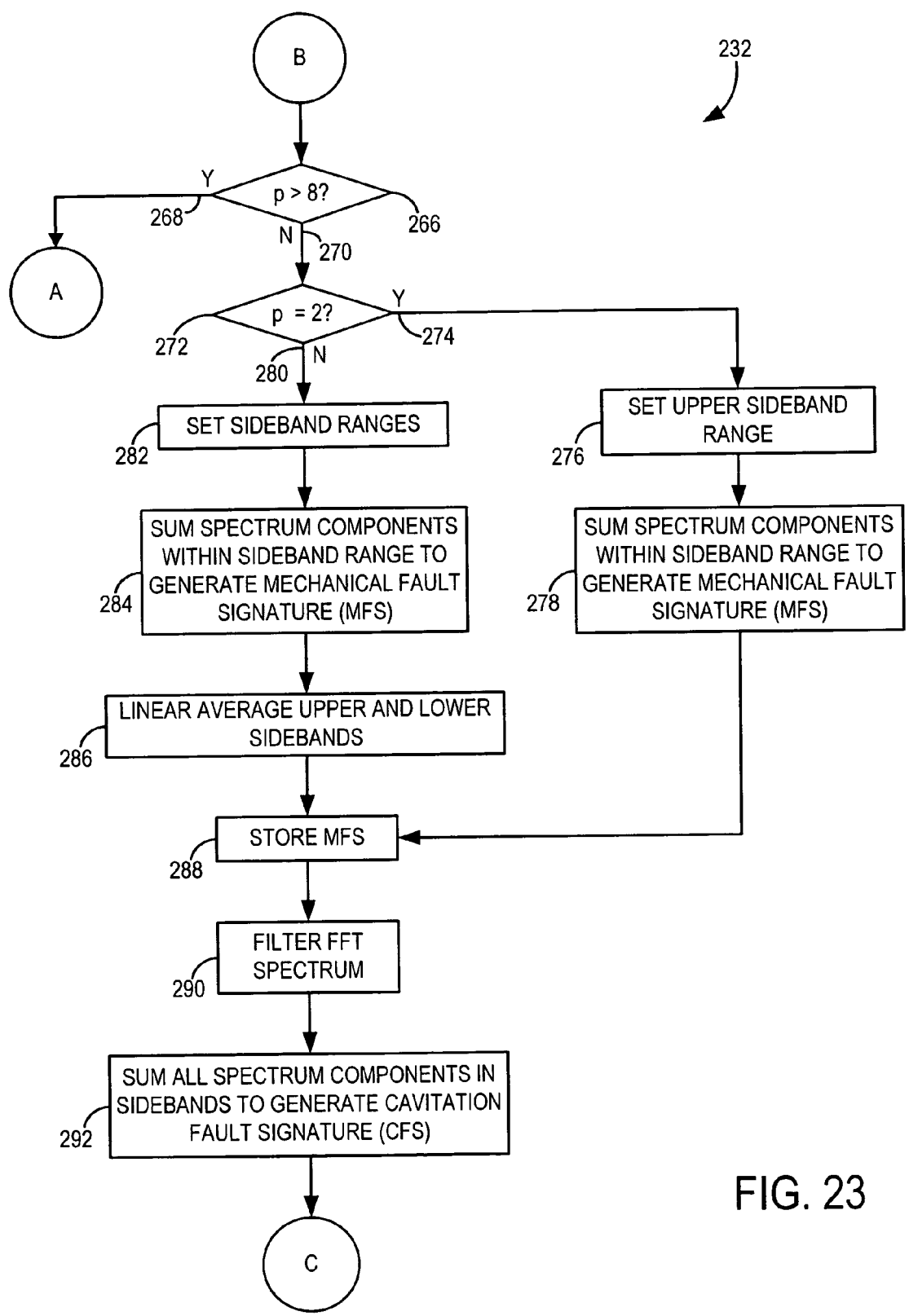
FIG. 23 is a continuation of the flow chart of FIG. 22 illustrating the steps of a technique for predictive fault detection in accordance with the present invention.

Referring now to FIG. 23, the monitoring algorithm 232 continues with a determination of whether the motor being monitored has more than 8 poles 266. If the motor does have more than 8 poles 268, the monitoring algorithm 232 simply reiterates. That is, in accordance with a preferred embodiment, motors with more than 8 poles are not monitored. While in a preferred embodiment, this threshold is set at 8 poles, it is contemplated that any number of poles may be selected as its threshold for comparison 266. However, if the motor has less than 8 poles 270, a second comparison is made to determine whether the motor is a 2 pole motor 272. If the motor has two poles 274, the upper sideband range for comparison and monitoring is from $F_{upper}$ to twice the system frequency less 0.2 Hz at step 276. Then for all spectrum components within the defined sideband range, the MFS is calculated 278 according to Equation 8.

However, if the motor is not a two pole motor 280, the upper sideband ranges are set 282 according to:

$$F_{upper} = (1+2/p)f_s \quad \text{(Eqn. 14),}$$

$$F_{lower} = (1-2/p)f_s \quad \text{(Eqn. 15).}$$

Once the upper and lower sideband ranges are defined 282, the MFS is calculated 284 for all spectrum components within each sideband according to Equation 8. The results from each sum within the sidebands are then subjected to a linear average 286 and the MFS is stored 288. Regarding the frequency spectrum of the notch current data, median filtering is performed 290 at a window length of 7. Then all spectrum components within the frequency spectrum of the notch current data within the upper and lower sidebands defined from $f_s-25$ to $f_s-5$ Hz and from $f_s+5$ to $f_s+25$ Hz, respectively, are summed and stored as a CFS 292. The monitoring algorithm then continues as will be described with respect to FIG. 24.

It is noted that the above equations illustrate theoretical values and, in practice, values may vary. For example, Eqns. 14 and 15 are shown as setting $F_{upper}$ and $F_{lower}$ equal to particular values. However, it is contemplated that variations in determining and/or calculating, for example, the number of poles or $f_s$, may cause $F_{upper}$ and/or $F_{lower}$ to vary from the theoretical values illustrated in Eqns. 14 and 15. Therefore, the above equations illustrate theoretical values that, in practice, may vary.

Figure 24:
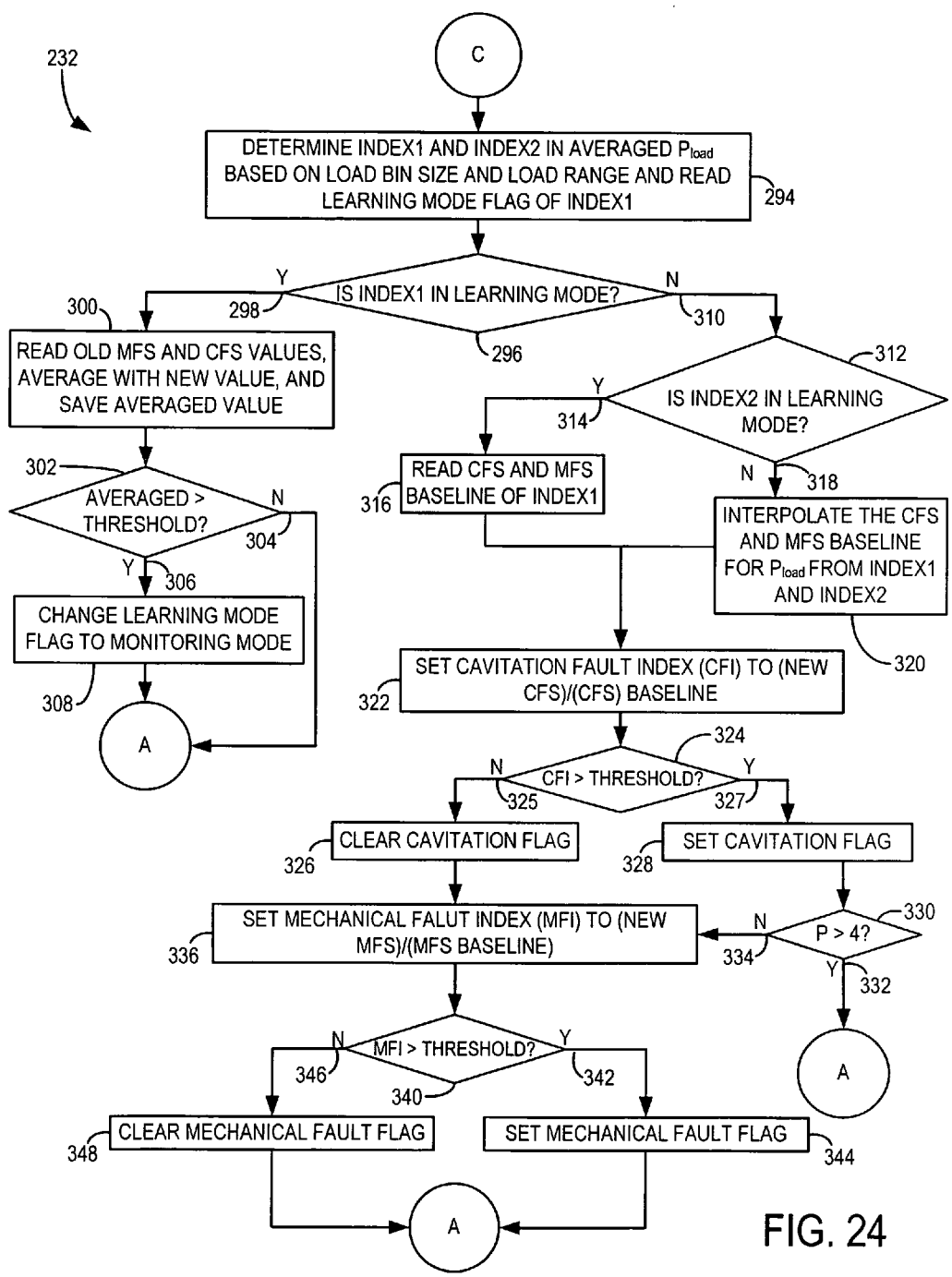
FIG. 24 is a continuation of the flow chart of FIG. 23 illustrating the steps of a technique for predictive fault detection in accordance with the present invention.

Referring now to FIG. 24, the monitoring algorithm 232 continues by determining two adjacent load bin index numbers (index1 and index2), for the averaged $P_{load}$ based on load bin size and load range respectively 294. The system then reviews index1 to determine whether index1 indicates that the system is in learning mode 293. If the system is in learning mode as indicated by index1 at step 298, the currently calculated MFS and CFS are averaged with previously stored CFS and MFS baseline data 300. The system then determines whether the baseline data has been averaged with new data from MFS and CFS calculations a minimum number of times at step 302. In accordance with one embodiment, the system determines whether the data has been averaged at least 50 times. To set and place the number of load bins across the various load ranges, it is contemplated that the RMS value of the frequency spectrum components may be averaged with the stored data and repeated at increments of 5% until the highest level of the load bins is reached. If sufficient averaging has not yet occurred 304, the monitoring algorithm 232 reiterates. However, if the baseline data has been averaged the minimum number of times 306, the system changes a flag with respect to index1 from learning mode to monitoring mode 308 and then the monitoring algorithm restarts.

However, if index1 indicates that the system is not in learning mode 310, a check is made to determine whether index2 indicates that the system is in learning mode 312. If index2 indicates that the system is in learning mode 314, the CFS and MFS baseline associated with index1 is loaded 316. However, if index2 indicates that the system is not in learning mode 318, the CFS and MFS associated with both index1 and index2 and the CFS and MFS baseline for $P_{load}$ is interpolated therefrom 320. The system then sets a cavitation fault index (CFI) variable equal to the newly read CFS 316 or the interpolated CFS 318 and divides it by the CFS baseline associated with index1 or the interpolated index1 and index2 at step 322. A comparison of the fault index is then made to a threshold 324. Again, it is contemplated that the threshold may be user defined, parameter determined, or preset and associated with the system. If the CFI is not greater than the threshold 325, the system clears the cavitation flag 326. However, if the CFI is greater than the threshold 327 the system sets a cavitation flag 328.

The system then determines whether the current motor is greater than 4 poles at step 330 and, if so 332, reiterates the monitoring algorithm. Should the motor being monitored not have greater than 4 poles 334, a mechanical fault index (MFI) is reset to the recently calculated or interpolated MFS and divided by the MFS baseline 336. The MFI is then compared to a threshold 340, and if greater than the threshold 342, a mechanical fault flag is set 344. On the other hand, if the MFI is not greater than the threshold 346, then the mechanical fault flag is cleared 348. In either case, the monitoring algorithm 232 then reiterates.

Figure 25:
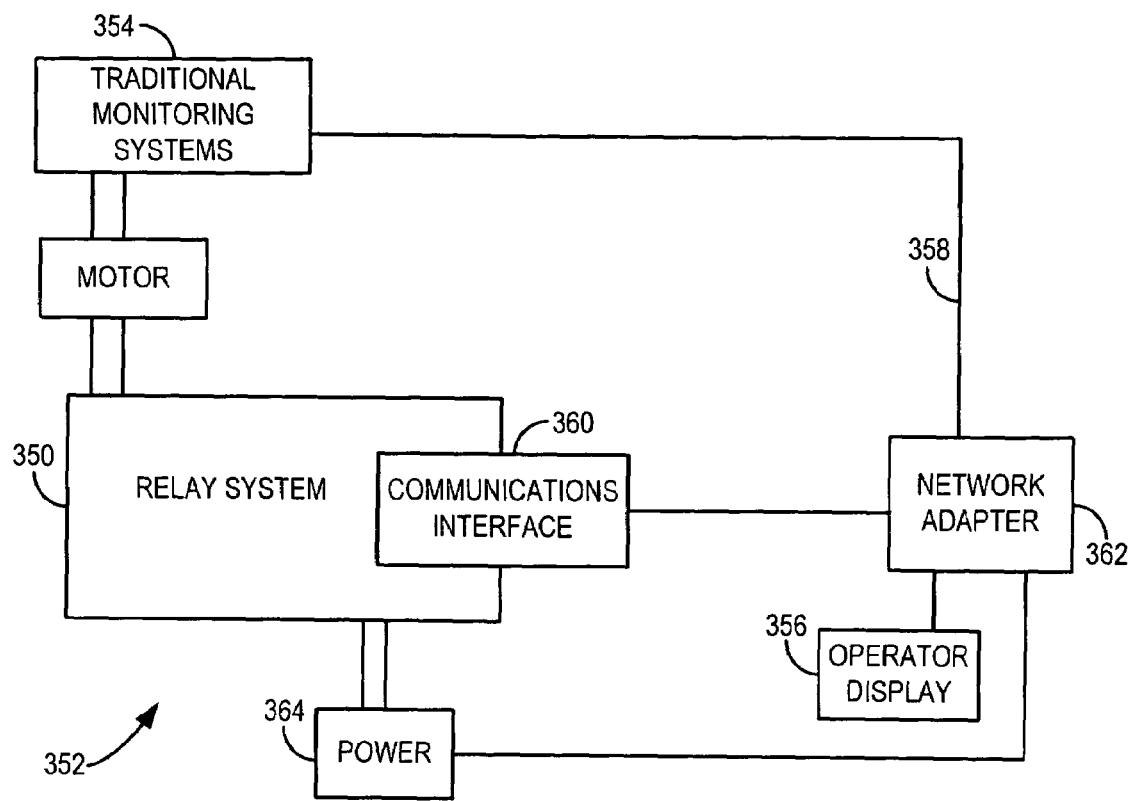
FIG. 25 is a block diagram of a communications system for communicating proactive alerts in accordance with the present invention.

Referring now to FIG. 25, a block diagram of the above-described wellness relay system 350 is shown within a motor system 352. The motor system 352 includes a known communications system traditionally used with such motor systems 352 to enable monitoring and traditional feedback systems 354 to communicate to an operator display 356 over a communications bus 358. The wellness relay system 350 includes a high speed, low-cost interconnect or interface 360, capable of allowing the wellness relay system 350 to communicate alerts and notices onto the communications bus 358. The interface 360 is not part of an additional network, but instead allows the wellness relay system 350 to have access to a common back-plane used to communicate information from the wellness relay system 350. It is contemplated that the communications bus 358 may be a control bus or other communications system of the motor system 352. It is further contemplated that the communications bus 358 may be similar to a common communications bus used to connect a keyboard to a personal computer. The communications interface 360 may be adapted to a specific protocol of the communications bus 358 so that the information from the wellness relay system 350 is available to the operator display 356.

It is contemplated that the wellness relay system 350 may operate similarly to traditional low voltage motor control centers (LVMCC). However, as previously described, the wellness relay system 350 includes many additional wellness detection features which distinguish it from traditional LVMCCs. Table II shows the available system information from the traditional LVMCC starter unit, typically communicated via programmable logic controller (PLC) input/output modules, as well as the information available from the wellness relay system 350. Accordingly, the wellness relay may provide feedback regarding trip times and dates and trip causes including at least motor overload, phase unbalance, and ground fault as well as impending fault condition alerts.

TABLE II

SYSTEM INFORMATION AVAILABILITY

| Control/Diagnostic Function | Traditional Relay | Wellness Relay System |
|---|---|---|
| Motor Start/Stop | X | X |
| Trip/Reset | X | X |
| Cause of Trip | | |
| Motor Overload | | X |
| Phase Unbalance | | X |
| Ground Fault | | X |
| Motor Phase Currents (Ia, Ib, Ic) | | X |
| Thermal Capacity | | X |
| Time/Date of Trip | | X |
| CBM Wellness Fault Detection | | |
| Cavitation | | X |
| Mechanical | | X |

Referring again to FIG. 25, the communications interface 360 enables the wellness relay system 350 to connect through one network adapter 362, which, in turn, allows all monitoring devices 354, 350 in one vertical structure to be connected to only one adapter 362. The wellness relay system 350 receives power from a power source 364. The power source 364 may also be used to power a contactor coil (not shown) and the network adapter 362 as well as the wellness relay system 350. In accordance with a preferred embodiment, a traditional 120 VAC control power transformer might be eliminated utilizing such an architecture. Although a general network adapter 362 and communications interface 360 are shown, many network adapters are contemplated.

Figure 26:
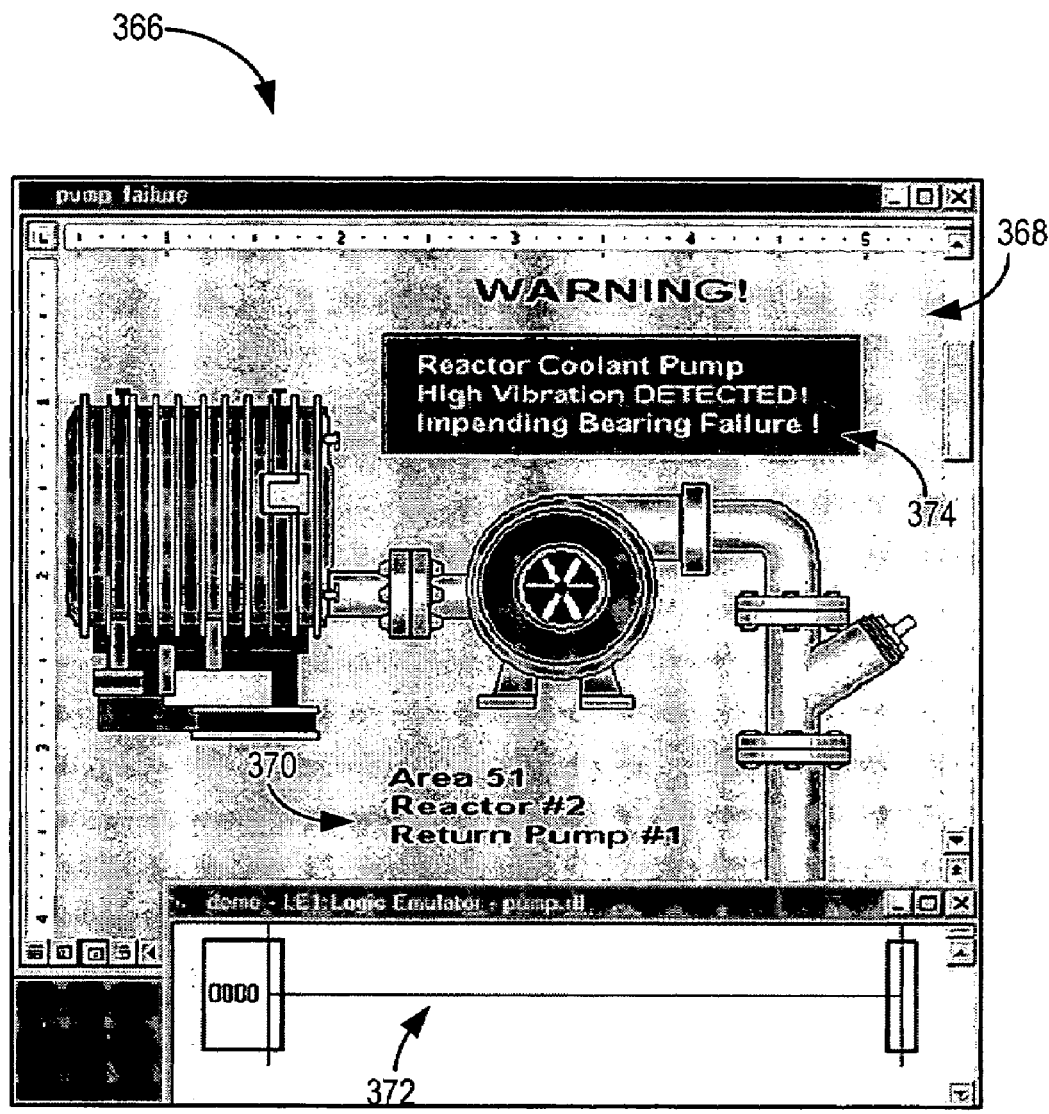
FIG. 26 is a representation of a graphical user interface in accordance with the present invention.

Referring now to FIG. 26, an operator interface 366 in accordance with the present invention is shown. The configuration of the operator interface 366 is designed to alert operators to specific conditions as communicated from the relay system. Diagnostic information 368 is available so that plant operators are able to quickly identify the motor's location 370, a time line 372, and any impending problem 374, such as pump cavitation or misalignment. The information communicated 370–374 allows the operator to schedule required maintenance to correct an identified problem 374. Unlike traditional motor control and protective devices, like a traditional overload relay, the above-described relay system can be designed to annunciate an impending fault without tripping the control circuit. FIG. 26 shows but one possible approach for an operator interface indicating high vibration, which could lead to an impending bearing failure.

Therefore, the present invention includes a power meter including a housing and a plurality of sensors configured to monitor operation of a motor. A processor is disposed within the housing and configured to receive operational feedback from the plurality of sensor and proactively determine an operational wellness of the motor from the operational feedback.

In another embodiment of the present invention, an overload relay includes a relay housing and a power meter disposed within the relay housing and configured to receive data from a motor and perform motor fault protection. A wellness system is disposed within the housing and configured to review the data and proactively determine a wellness of the motor to generate condition based maintenance alerts.

An alternate embodiment of the present invention has a kit that is configured to retrofit a relay. The kit includes a housing having dimensions substantially similar to an overload relay and an interface configured to receive feedback from a plurality of sensors monitoring a motor. A wellness system is disposed within the housing and configured to receive the feedback from the interface and determine whether preventative maintenance is required on the motor.

Another embodiment of the present invention includes a controller configured to detect indicia of motor faults. The controller has a processor configured to determine motor parameters of a given motor, generate a set of baseline data for the given motor, and acquire current data from the given motor during operation. The processor is also configured to isolate sidebands within the current data, map the current data within the sidebands to one of a plurality of bins, and compare the current data within the sidebands to baseline data from the set of baseline data associated with the bin. The processor is then configured to determine a predictive fault index of the given motor prior to an actual fault occurrence.

A further embodiment of the present invention has a method of monitoring a motor for potential faults. The method includes receiving current data from an operating motor, performing at least one FFT on the current data to generate frequency spectrum data, and isolating sidebands within the frequency spectrum data based on a system frequency of the operating motor. The method also includes accumulating spectrum components of the frequency spectrum data within sidebands and generating baseline data from the accumulated spectrum components for a predetermined period. Then, after the predetermined period, the method includes comparing the spectrum components to the baseline and determining a noise pattern indicative of potential faults due to pump cavitation within the spectrum components.

Another embodiment of the present invention includes a computer readable storage medium having stored thereon a computer program. The computer program includes instructions which, when executed by at least one processor, cause the at least one processor to determine a load on a motor and receive operational current data from the motor. The at least one processor is also caused to perform at least two FFTs on the operational current data to generate frequency spectrum data, average the frequency spectrum data, and define sidebands of the system frequency of the motor. The at least one processor is also caused to sum the frequency spectrum data within sidebands to generate a cavitation fault index, map the cavitation fault index to a load bin from a plurality of load bins based on the load on the motor, and average the cavitation fault index with baseline data associated with the load bin if in a learning mode. However, if not in the learning mode, the at least one processor is caused to compare the cavitation fault index to the baseline data associated with the load bin to determine an impending cavitation fault before a fault occurrence.

An additional embodiment of the present invention includes a controller configured to detect indicia of impending mechanical motor faults. The controller includes a processor configured to determine motor parameters of a given motor including a load, generate a set of baseline data for the given motor, and acquire current spectrum data from the given motor during operation. The processor is also caused to map at least one from a plurality of load bins based on the load and generate a mechanical fault signature from the current spectrum. The processor is caused to compare the mechanical fault signature to baseline data from the set of baseline data corresponding to the mapped bin and determine amplitude variances within the mechanical fault signature indicative of an impending mechanical fault prior to an actual mechanical fault occurrence.

In another embodiment of the present invention, a method of detecting impending mechanical faults includes generating baseline data for the operating motor and receiving current data from an operating motor. The method also includes performing at least one FFT on the current data to generate frequency spectrum data, selecting system frequency sidebands within the frequency spectrum data, and summing the frequency spectrum data within the system frequency sidebands. The method includes comparing the summed frequency spectrum data to a portion of the baseline data and determining amplitude variances within a component of a running shaft speed of the motor indicative of prospective faults due to at least one of motor misalignment and unbalance.

An alternate embodiment of the present invention has a computer readable storage medium having stored thereon a computer program comprising instructions which, when executed by at least one processor, cause the at least one processor to receive operational current data from a motor. The at least one processor is also caused to perform at least two FFTs on the operational current data to generate frequency spectrum data, average the frequency spectrum data, and generate a mechanical fault signature from frequency spectrum data. If in a learning mode, the at least one processor is caused to compile a baseline from the mechanical fault index. However, if not in the learning mode, the at least one processor is caused to determine a load of the motor and map the average power of the motor to a load bin based on the load of the operating motor. The processor is also caused to compare a portion of the baseline corresponding to the mapped load bin to the mechanical fault signature and determine an impending mechanical fault before a fault occurrence.

The present invention has been described in terms of the preferred embodiment, and it is recognized that equivalents, alternatives, and modifications, aside from those expressly stated, are possible and within the scope of the appending claims.

What is claimed is:

1. A power meter comprising:
a housing;
a plurality of sensors configured to monitor operation of a motor;
a processor disposed within the housing and configured to receive operational feedback from the plurality of sensors and proactively determine an operational wellness of the motor from the operational feedback;
wherein the processor is further configured to generate baseline data from the operational feedback during known healthy operation of the motor; and
wherein the processor is further configured to perform a fast Fourier Transform (FFT) on the operational feedback to compare a frequency spectrum of the operational feedback to the baseline data to determine the operational wellness of the motor.

2. The power meter of claim 1 wherein the processor is further configured to output proactive operational wellness alerts to a display.

3. The power meter of claim 2 wherein the proactive operational alerts include pump cavitation alerts, motor alignment alerts, and motor rotational unbalance alerts.

4. The power meter of claim 2 further comprising a communications interface configured to be connected to a communications bus to communicate the proactive operational alerts to the display.

5. The power meter of claim 1 wherein the plurality of sensors are configured to non-invasively monitor operation of the motor.

6. The power meter of claim 1 wherein the plurality of sensors include a sensor configured to monitor a three-phase current and voltage of the motor.

7. The power meter of claim 1 further comprising a notch filter configured to remove a fundamental frequency of the motor from the operational feedback.

8. The power meter of claim 7 wherein the notch filter is configured to be adaptive to track the fundamental frequency of the motor and an accompanying inverter.

9. The power meter of claim 1 incorporated into a relay.

10. The power meter of claim 1 wherein the operational feedback includes at least one of current data, voltage data, and power data.

11. An overload relay comprising:
a relay housing;
a power meter disposed within the relay housing and configured to receive data from a motor and perform motor fault protection;
a wellness system disposed within the housing and configured to review the data and proactively determine a wellness of the motor to generate condition based maintenance alerts
wherein the wellness system is further configured to communicate the condition based maintenance alerts upon determining an undesirable wellness of the motor; and
wherein the condition based maintenance alerts are communicated over a communications network to an operator display.

12. The overload relay of claim 11 wherein the wellness system is further configured to detect pump cavitation, motor misalignment, and motor rotational unbalance to determine the wellness of the motor.

13. The overload relay of claim 12 wherein pump cavitation, motor misalignment, and motor rotational unbalance are detected non-invasively while the motor is operational.

14. The overload relay of claim 11 wherein the wellness system is further configured to communicate the condition based maintenance alerts without tripping the motor.

15. The overload relay of claim 11 further comprising a circuit configured to perform motor start/stop functions and motor trip/reset functions.

16. The overload relay of claim 11 further comprising a circuit configured to provide feedback regarding trip times and dates and trip causes including at least motor overload, phase unbalance, and ground fault.

17. The overload relay of claim 11 wherein the power meter is further configured to monitor motor phase currents and thermal capacity.

18. A kit configured to retrofit a relay comprising:
a housing having dimensions substantially similar to an overload relay;
an interface configured to receive feedback from a plurality of sensors monitoring a motor;
a wellness system disposed within the housing and configured to receive the feedback from the interface and determine whether preventative maintenance is required on the motor
wherein the wellness system is further configured to compare the feedback to historical data and output preventative maintenance alerts if the feedback is outside a tolerance; and
wherein the preventative maintenance alerts include cavitation alerts, motor alignment alerts, and motor rotational unbalance alerts.

19. The kit of claim 18 further comprising a housing and wherein the interface is disposed within the housing.

20. The kit of claim 19 wherein the housing is configured to be substantially similar to a relay housing configured to not have a wellness system disposed therein.

21. The kit of claim 18 further comprising a communications interface configured to be connected to a communications bus to communicate preventative maintenance alerts to an operator display.

22. The kit of claim 18 wherein the wellness system is further configured to provide non-invasive diagnostic feedback.

23. The kit of claim 18 wherein the wellness system is further configured to operate in a learning mode to populate historical data.

24. The kit of claim 18 wherein the wellness system is configured to perform motor fault signature analysis to diagnose impending motor faults.

25. The kit of claim 24 wherein the impending motor faults include potential cavitation faults and mechanical faults.

* * * * *